(12) United States Patent
Matsumoto

(10) Patent No.: US 6,285,033 B1
(45) Date of Patent: Sep. 4, 2001

(54) POSITIONAL DEVIATION DETECTING METHOD AND DEVICE MANUFACTURING METHOD USING THE SAME

(75) Inventor: Takahiro Matsumoto, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/192,193

(22) Filed: Nov. 16, 1998

(30) Foreign Application Priority Data

Nov. 14, 1997 (JP) .................................................. 9-331261

(51) Int. Cl.⁷ .................................................. G01N 21/86
(52) U.S. Cl. .................................. 250/548; 356/401
(58) Field of Search ............................. 250/548, 237 G, 250/557; 356/354, 356, 363, 373, 375, 399, 400, 401

(56) References Cited

U.S. PATENT DOCUMENTS

| 5,432,603 | 7/1995 | Sentoku et al. .......................... 356/349 |
| 5,625,453 | 4/1997 | Matsumoto et al. .................. 356/351 |
| 5,682,239 | 10/1997 | Matsumoto et al. .................. 356/349 |

FOREIGN PATENT DOCUMENTS 2-167413    6/1990 (JP) .

*Primary Examiner*—John R. Lee
*Assistant Examiner*—Kevin Pyo
(74) *Attorney, Agent, or Firm*—Fitzpatrick, Cella, Harper & Scinto

(57) ABSTRACT

A method of detecting a relative positional deviation between first and second objects by use of a first alignment mark provided on the first object and a second alignment mark provided on the second object, wherein the first alignment mark includes a first grating lens and a second grating lens having a mirror image of the first grating lens, and the alignment mark includes a third grating lens and a fourth grating lens having a mirror image of the third grating lens. The incidence position information of first light coming via the first grating lens and the third grating lens and incident upon a first predetermined plane, and the incidence position of second light coming via the second grating lens and the fourth grating lens and incident upon a second predetermined plane, are detected, on the basis of which the relative positional deviation between the first and second objects in a predetermined direction is detected.

14 Claims, 21 Drawing Sheets

DIE-BY-DIE ALIGNMENT

GLOBAL ALIGNMENT

| SHOT # | 1 | 2 | 3 | ....... N |
|---|---|---|---|---|
| X [nm] | −2 | 5 | (−2.5) | ......... |
| Y [nm] | −3 | (20) | 5 | ......... |
| θ [urad] | 0.05 | (0.2) | −0.1 | ......... |

◯ DIE-BY-DIE ALIGNMENT

POSITIONAL DEVIATION DETECTING METHOD AND DEVICE MANUFACTURING METHOD USING THE SAME

FIELD OF THE INVENTION AND RELATED ART

This invention relates to a positional deviation detecting method, and to an exposure apparatus or a device manufacturing method using the same. The present invention is particularly suitable for use in an exposure apparatus or a scan type exposure apparatus to be used in a lithographic process for the manufacture of microdevices such as semiconductor devices (e.g., IC or LSI), image pickup devices (e.g., CCD), display devices (e.g., liquid crystal panel) or magnetic heads, for example, for relative positioning or alignment between a first object such as a mask or reticle (hereinafter "mask") and a second object such as a wafer when a fine pattern such as an electronic circuit pattern formed on the first object is to be lithographically transferred to the second object.

In exposure apparatuses for device manufacture, relative alignment of a mask and a wafer is an important factor in improvement of performance. For a DRAM which is a representative semiconductor integrated circuit, an overall registration precision of about ⅓ to ¼ of the minimum linewidth of a resolution pattern image is required. Particularly, in recent exposure apparatuses, an alignment precision of 20 nm or less is required to meet further enlargement of integration of semiconductor chips.

For a 1-Gbit DRAM currently being developed, an overall registration precision of 40 nm to 50 nm is required and, within it, the precision to be shared for the alignment precision will be 10–15 nm.

In many exposure apparatuses, a mask and a wafer are formed with positioning marks, called alignment marks. A positional deviation between these alignment marks is optically detected and, on the basis of a detected value, the positioning (alignment) of the mask and the wafer is performed. As for detection of alignment marks, there are a method in which a mark is optically enlarged and projected on a CCD by which image processing is performed; a method in which a straight diffraction grating is used as a mark and the phase of diffractive light produced thereby is measured; and a method in which a zone plate (grating lens) is used as a mark and light diffracted by the zone plate is detected upon a predetermined plane, whereby positional deviation of the diffracted light is detected.

Among these detection methods, the methods that use a straight diffraction grating or a zone plate as an alignment mark have a feature that, in the sense that detection is less influenced by any defect or fault of the mark, it is tough on the semiconductor process and enables relatively high precision alignment.

FIG. 1A is a schematic view of a position detecting system of a conventional type. In the drawing, parallel light emitted from a light source 72 passes through a half mirror 74 and, then, it is collected by a condenser lens 76 toward a convergence point 78. After this, the light illuminates a mask alignment pattern 68a upon the surface of a mask 68 and a wafer alignment pattern 60a upon the surface of a wafer 60. The alignment patterns 68a and 60a each comprises a reflection type zone plate which serves to define a spot of light convergence upon a plane which is orthogonal to the optical axis, passing through the convergence point 78. A deviation of light convergence spot position upon that plane is detected by a detector 82, with the light being guided thereto by the condenser lens 76 and another lens 80.

Control circuit 84 actuates a driving circuit 64 on the basis of an output signal from the detector 82, by which relative positioning of the mask 68 and the wafer 60 is performed.

FIG. 1B is a schematic view for explaining the imaging relation of lights from the mask alignment pattern 68a and the wafer alignment pattern 60a, shown in FIG. 1A.

In FIG. 1B, a portion of the light divergently emitted from the light convergence point 78 is diffracted by the mask alignment pattern 68a, by which a light convergence point 78a, representing the position of the mask, is defined adjacent to the point 78. Also, another portion of the light passes through the mask 68 as zeroth order transmissive light and, with its wavefront unchanged, it impinges on the wafer alignment pattern 60a on the wafer 60 surface. After being diffracted by the pattern 60a, the light passes through the mask 68 again as zeroth order transmissive light, and it is collected in the neighborhood of the light convergence point 78, whereby a light convergence point 78b representing the position of the wafer is produced.

In FIG. 1B, when the light diffracted by the wafer 60 defines a light convergence spot, the mask 68 serves simply as a transparent member.

The position of the light convergence point 78b thus produced by the wafer alignment pattern 60a bears a deviation $\Delta\sigma'$ corresponding to a deviation $\Delta\sigma$ of the wafer 60 with respect to the mask 68, in a direction (lateral direction) along the mask or wafer surface and along a plane perpendicular to the optical axis, passing through the light convergence point 78.

The amount of this deviation $\Delta\sigma'$ is measured with reference to an absolute coordinate system defined upon a sensor, whereby the deviation $\Delta\sigma$ is detected.

Usually, for alignment of a mask and a wafer based on detection of a positional deviation therebetween, the mask and the wafer are controlled to be placed with a mutual spacing in a predetermined range and, thereafter, they are brought into alignment on the basis of positional information obtainable from a sensor by use of alignment patterns provided on the mask and the wafer.

Such a method, however, involves a problem that Fraunhofer diffraction light from openings of mask and wafer alignment marks enter a central portion of a sensor, to cause interference with signal light that results in a decreased signal-to-noise ratio of a produced alignment signal as well as non-linearity of a signal to the mask-to-wafer relative deviation.

The influence of such Fraunhofer diffraction light may be reduced by arranging, as shown in FIG. 1C, a wafer alignment mark WA with eccentricity with respect to a mask alignment mark MA, in a state where there is no positional deviation between a mask circuit pattern and a wafer circuit pattern. With this arrangement, since the Fraunhofer diffraction light from the openings is spatially separated from the signal light, the influence of interference is reduced and a good signal is produced.

With this method, however, since the wafer alignment mark WA has a shape asymmetrical with respect to the alignment detecting direction, as shown in FIG. 1C, there is a problem that asymmetrical non-uniformness of diffraction efficiency is easily produced within the alignment mark.

If the diffraction efficiency distribution within the mark is asymmetric, a beam spot of signal light produced on a sensor becomes asymmetric. It causes a shift of the peak position and gravity center position of the spot, which leads to a detection error. The degree of influence to asymmetry of a signal light spot of the asymmetry of diffraction efficiency distribution within the mark, becomes notable with a larger deviation of the mask-to-wafer spacing (gap) with respect to a design gap, since it causes defocus of the spot.

The non-uniformness of diffraction efficiency within the mark may be attributable to the fact that: since an alignment mark has a power with respect to the alignment direction, the pitch thereof (i.e., the linewidth thereof) changes within the pattern, whereas it is difficult to control the linewidth and pattern step height (level difference) over the whole wafer surface, with respect to every linewidth and throughout the etching process, the deposition process and so on of the device process.

Particularly, due to miniaturization of a circuit pattern, the linewidth of a circuit pattern is 0.15 micron or less and the linewidth range of an alignment mark is widened, from a few microns to about 10 microns. Further, the diameter of a wafer is enlarged. In consideration of these tendencies, the problem of alignment detection error resulting from non-uniformness of linewidth or level difference of an alignment mark of a wafer will become serious.

Further, in addition to the signal light diffracted by a mask alignment mark and then by a wafer alignment mark and transmitted through a mask, there is unwanted diffractive light produced, which is transmitted through the mask alignment mark, diffracted by the wafer alignment mark, and then diffracted by the mask alignment mark. If the level difference of the wafer alignment mark varies, the intensity ratio between the signal light and such unwanted diffractive light changes, causing a detection error. Moreover, in relation to a global alignment process which is very advantageous with respect to throughput, there is a problem that any local distortion due to a wafer process cannot be corrected.

While the problems described above all concern deterioration of precision which is attributable to a semiconductor process, there is another problem of deterioration of registration precision which is caused by a large sensitivity of an alignment detection system. Even when an alignment mark is provided in good order, if the signal light has an angle $\theta$ to the optical axis (FIG. 1D), due to a set gap error $\delta g$ of mask and wafer, the spot position displaces by $\tan(\theta) \cdot \delta g$, causing a detection error.

Deterioration of registration precision attributable to the sensitivity of the alignment detecting system such as gap variation or deterioration of registration precision resulting from deformation or local distortion of an alignment mark due to a process, as described above, is not a problem solely peculiar to an alignment method using a zone plate or grating lens but a problem also involved in the other alignment methods described hereinbefore.

SUMMARY OF THE INVENTION

It is an object of the present invention to provide a positional deviation detecting method in which appropriately set plural grating lenses each having a power in a positional deviation detecting direction (X direction) are provided on a first object (mask) and a second object (wafer), and in which relative positional deviation between the mask and the wafer can be detected very precisely on the basis of a deviation of incidence position upon a predetermined plane of light coming from the grating lenses of the mask and the wafer, such that high precision alignment is assured.

It is another object of the present invention to provide an exposure apparatus and/or a device manufacturing method which uses such a positional deviation detecting method.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 18 is a schematic view for explaining selection of a die-by-die shot, in an embodiment of the present invention.

DESCRIPTION OF THE PREFERRED EMBODIMENTS

A positional deviation detecting method and device manufacturing method according to the present invention will now be described in detail with reference to preferred embodiments.

Figure 1A:
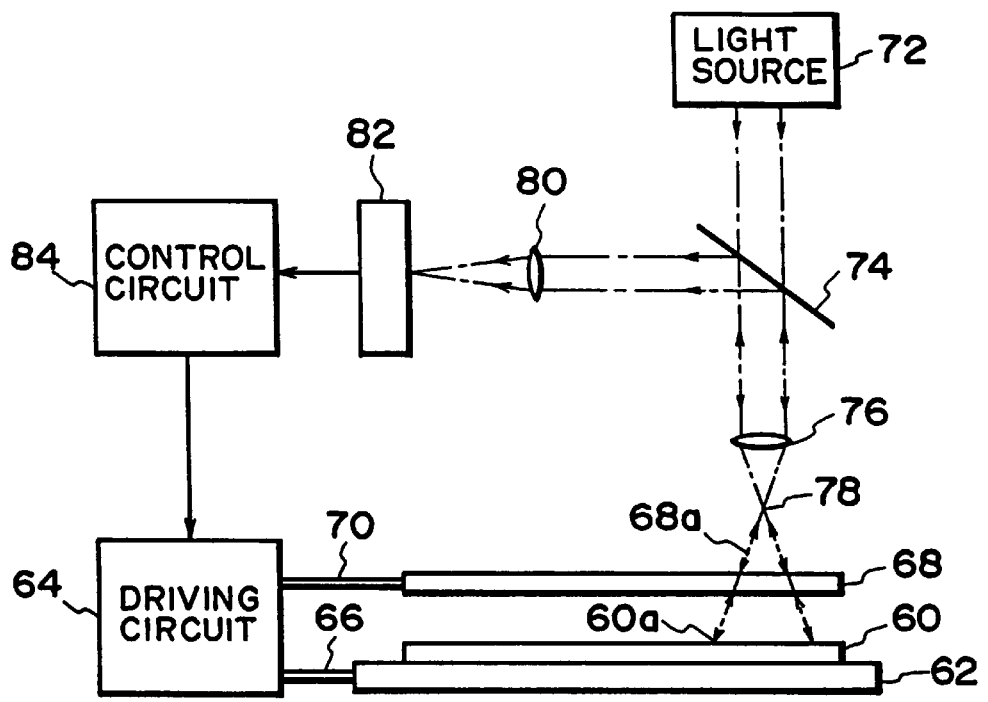
FIG. 1A is a schematic view of a positional deviation detecting system of a conventional type.
Figure 1B:
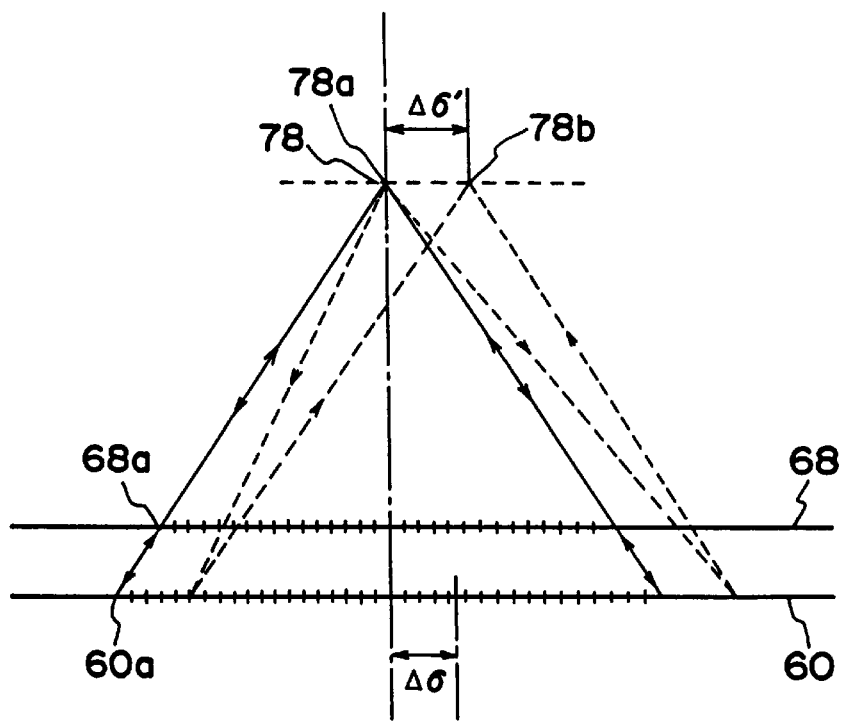
FIG. 1B is a schematic and enlarged view of a portion of FIG. 1A.
Figure 1C:
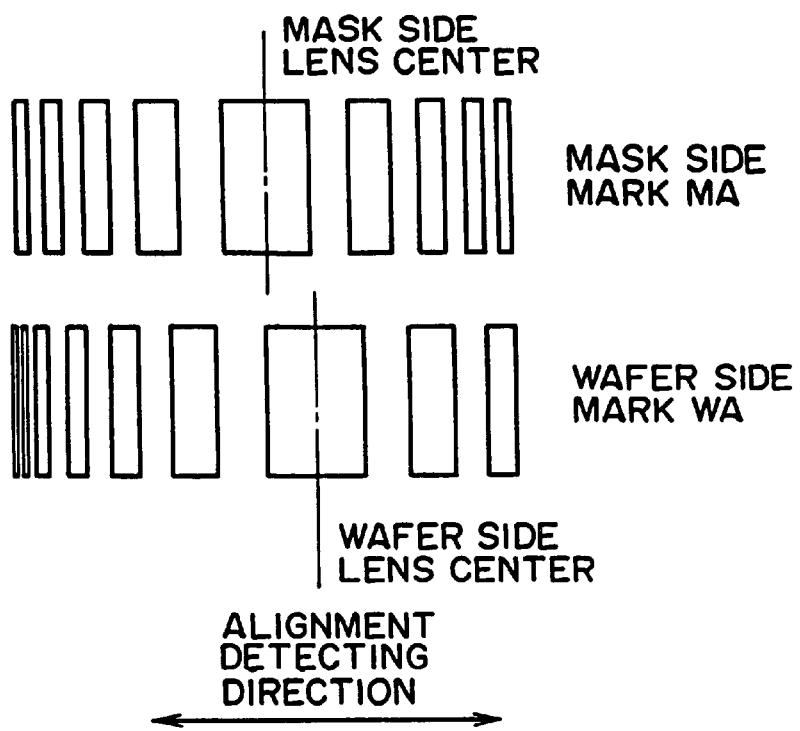
FIG. 1C is a schematic view of an example of alignment marks of a known type.
Figure 1D:
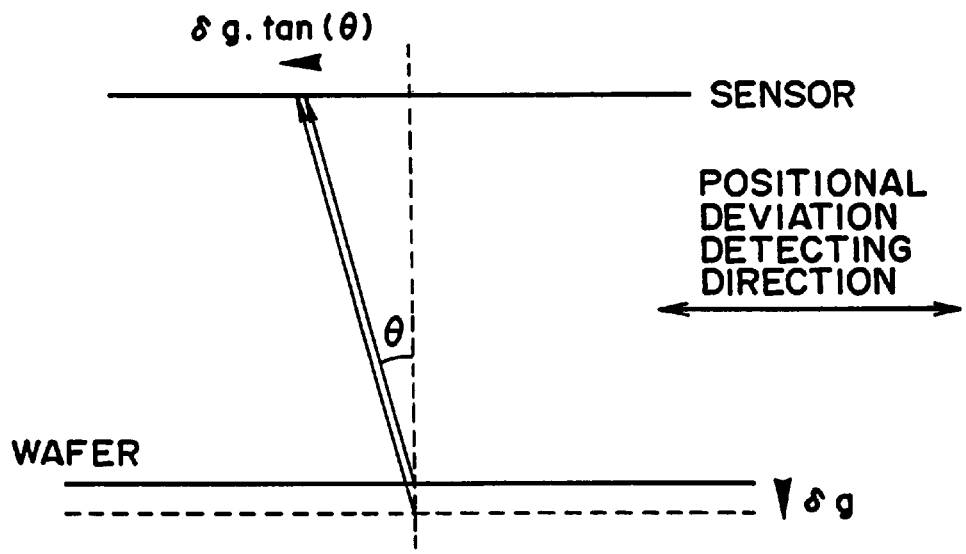
FIG. 1D is a schematic view for explaining the function of a conventional positional deviation detecting system.
Figure 2:
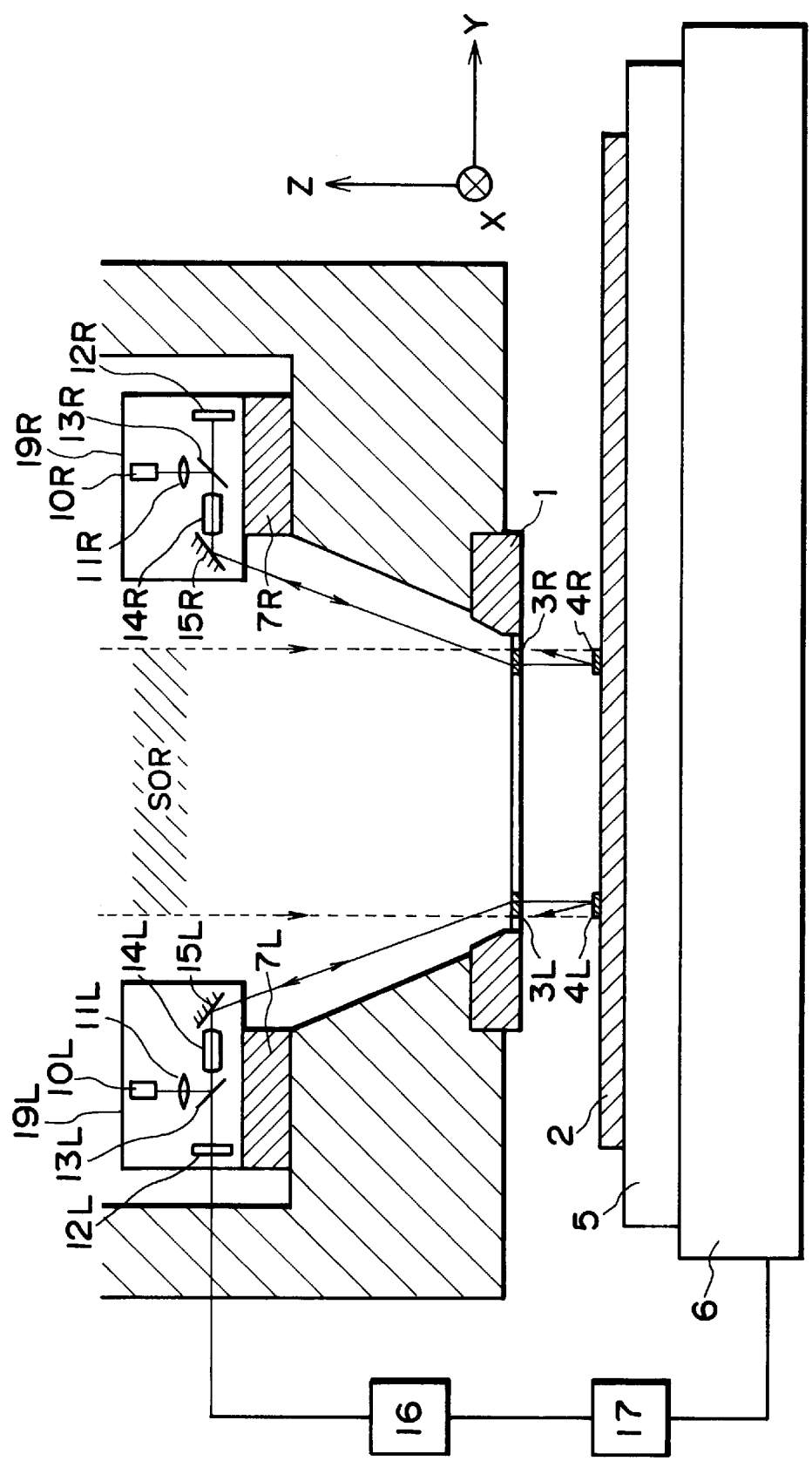
FIG. 2 is a schematic view of a main portion of a positional deviation detecting system according to a first embodiment of the present invention.
Figure 3A:
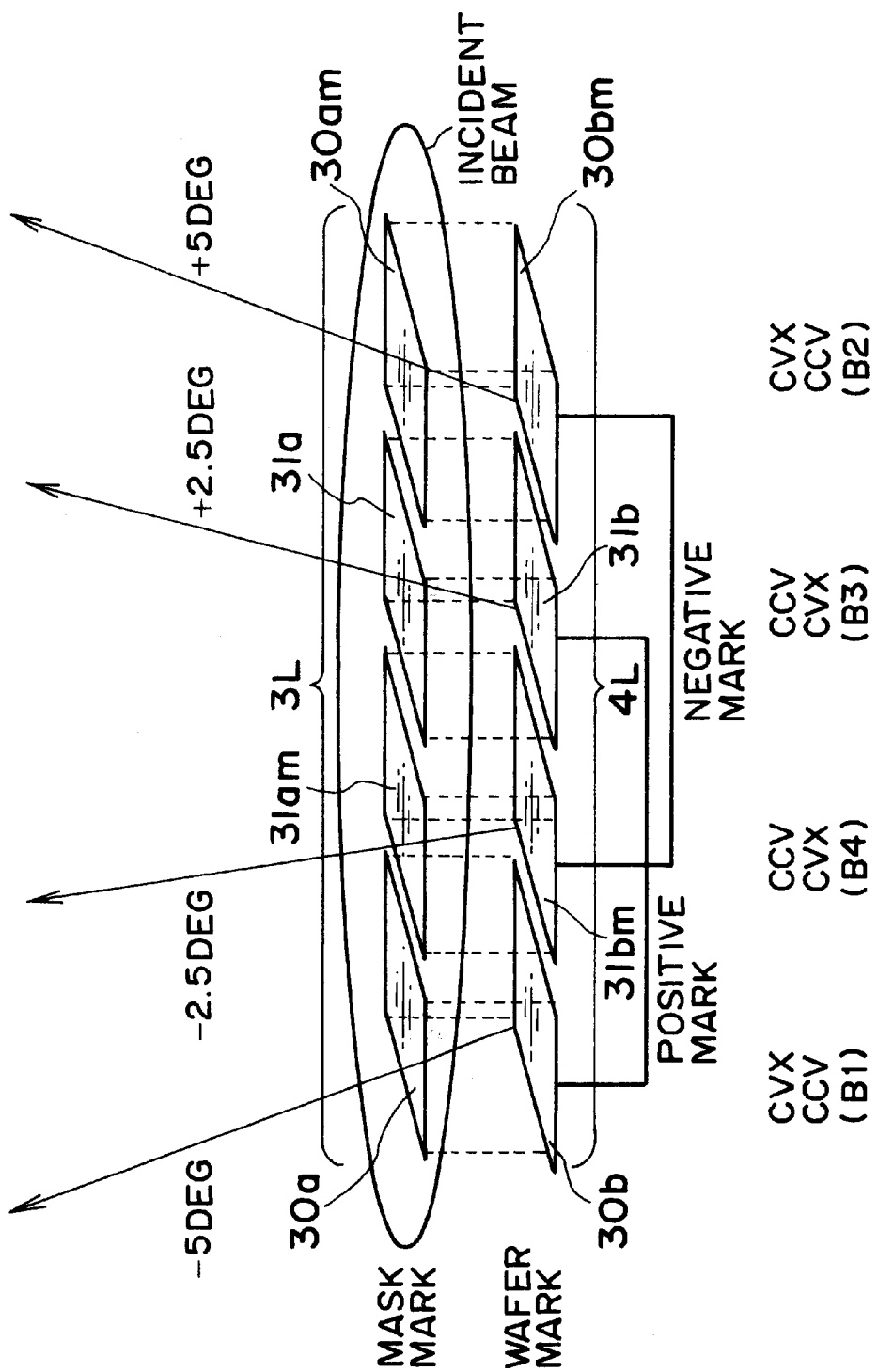
FIG. 3A is a schematic view for explaining alignment marks usable in the first embodiment.
Figure 3B:
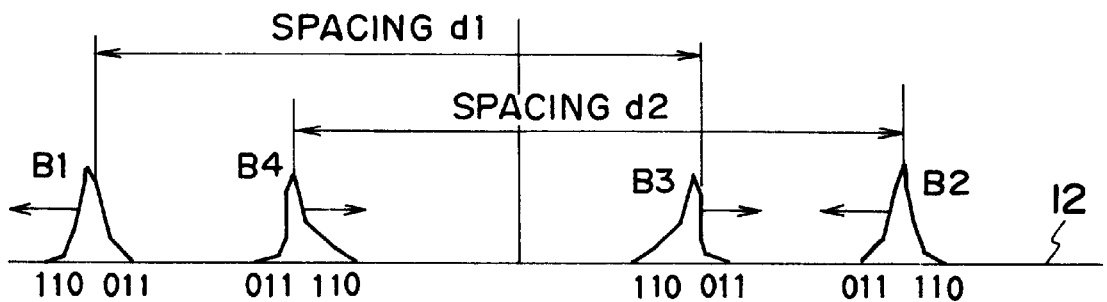
FIG. 3B is a schematic view for explaining a signal waveform on the sensor surface in the first embodiment.
Figure 4:
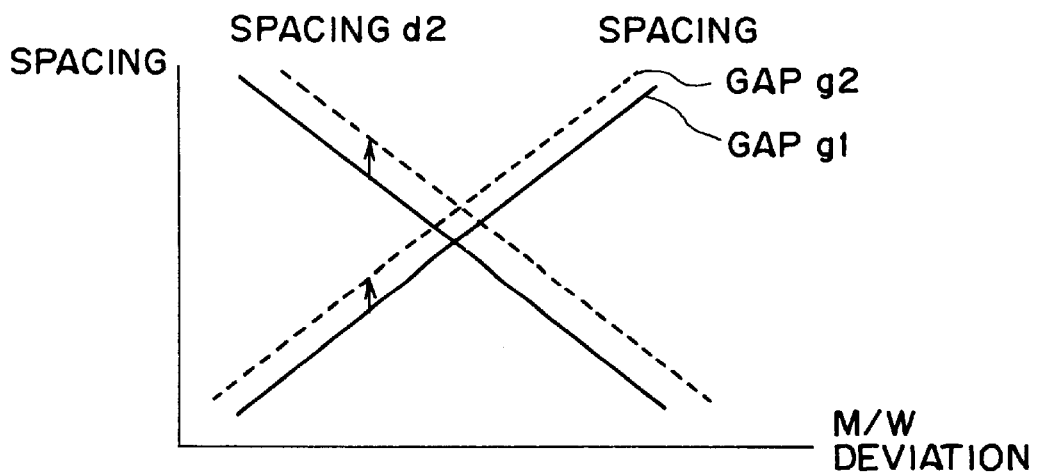
FIG. 4 is a graph for explaining a signal characteristic in the first embodiment of the present invention.
Figure 5:
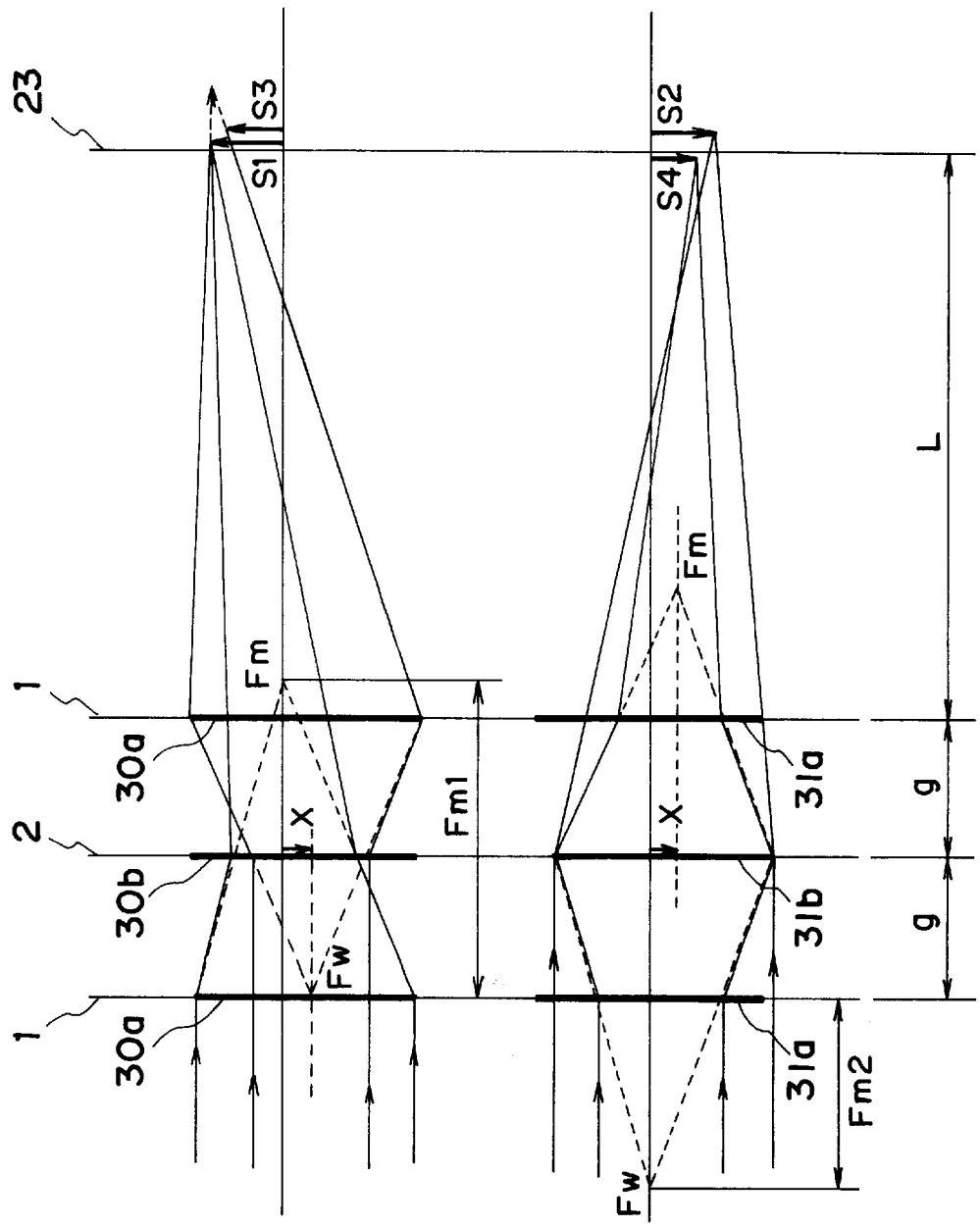
FIG. 5 is a schematic view for explaining the principle of positional deviation detection in the first embodiment of the present invention.
Figure 6:
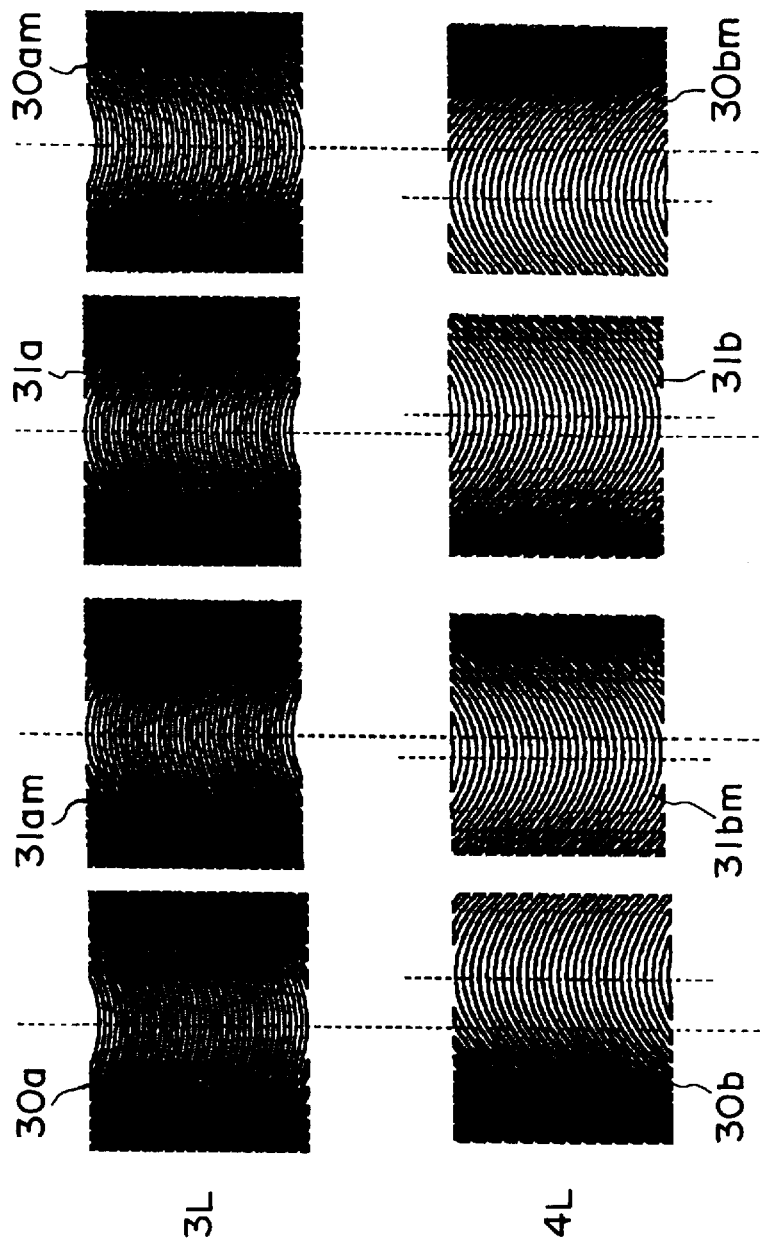
FIG. 6 is a schematic view of alignment marks usable in the first embodiment of the present invention.

FIG. 2 is a schematic view of a main portion of a positional deviation detecting system according to a first embodiment of the present invention. FIG. 3A is a schematic view for explaining diffraction of light by alignment marks of FIG. 2. FIG. 3B is a schematic view for explaining a signal waveform on the sensor surface in FIG. 2. FIG. 4 is a graph for explaining a signal characteristic under a relative positional relation between a first object (mask) and a second object (wafer). FIG. 5 is a schematic view of light paths of an optical system, as expanded, in accordance with the positional deviation detecting method of FIG. 2. FIG. 6 is a schematic view of alignment marks of FIG. 2.

In this embodiment, a positional deviation detecting system of the present invention is incorporated into an exposure apparatus for the manufacture of devices, using X-rays as an exposure light source. In these drawings, denoted at 1 is a mask (first object), and denoted at 2 is a wafer (second object). Light from an alignment optical unit 19 (19L, 19R) is projected onto an alignment mark 3 (3L, 3R) provided on the mask 1, in an oblique direction, such that the alignment operation is performed without blocking the exposure light.

This structure provides the ability to hold the alignment optical unit 19 fixed, such that alignment of the first and second objects 1 and 2 as well as the exposure process can be performed in parallel. Particularly, this is very effective for improvement of throughput in an exposure apparatus using a die-by-die alignment method.

Components of this embodiment will be described in greater detail. In FIG. 2, on the mask 1, there are alignment marks (first alignment marks or mask side marks) 3L and 3R each comprising a Fresnel zone plate (grating lens) having a power only in the X direction, i.e., the direction with respect to which positional deviation between the mask 1 and the wafer 2 is to be detected. On the wafer 2, there are alignment marks (second alignment marks or wafer side marks) 4L and 4R each comprising a Fresnel zone plate (grating lens) having a power only in the X direction and each to be positioned with respect to the mask alignment mark 3L or 3R.

Denoted at 19L and 19R are first and second alignment optical units each for detecting a positional deviation between the alignment marks 3L and 4L (3R and 4R). These alignment optical units are mounted on movable stages 7L and 7R which are movable in X and Y directions. Since the alignment optical units 19L and 19R have the same structure, the following description will be made of only one alignment optical unit 19L.

Denoted at 10L is a semiconductor laser (light source). The light emitted from the light source 10L goes through a light projecting lens 11L and a half mirror 13L, and it is collected by a lens 14L. Then, the light is reflected by a mirror 15L, and it is projected on the alignment mark (first alignment mark) 3L on the mask 1 with a projection angle θ. The alignment mark 3L functions to project light in a direction (−Z direction) of a normal of the mask 1, toward and upon the alignment mark (second alignment mark) 4L. The light thus projected on the mark 4L is diffracted at an angle θ the same as the projection angle θ. Light 110 which is provided by diffractive light from the mark 4L and which is simply passed through the mask 1, is reflected by the mirror 15L and then passes through the lens 14L and half mirror 13L. Finally, it is collected upon a sensor 12L. The sensor 12L comprises a one-dimensional line sensor.

Denoted at 5 in FIG. 2 is a wafer chuck for holding the wafer 2 by attraction. Denoted at 6 is an X-Y-Z stage. The mask 1 and the wafer 2 can be held with a predetermined spacing maintained therebetween, by moving the Z stage.

While not shown in FIG. 2, in addition to the first and second alignment optical units 19L and 19R for detection of a deviation in the X direction, in this embodiment, there are alignment marks comprising Fresnel zone plates having a power in the Y direction which are provided on scribe lines upon the mask 1 and the wafer 2, for detection of a positional deviation in the Y direction. A third alignment optical unit for detecting these alignment marks is provided.

Signals from sensors of these alignment optical units are applied to a CPU 16. The amount of deviation in the X direction is detected from an average of sensor outputs of the two alignment optical units for X-direction detection. The rotational amount is detected from the difference between the outputs. The amount of deviation in the Y direction is calculated from the sensor output of the Y-direction alignment optical unit. Positional deviations of a few shots on the wafer 2 are detected in this manner, and a signal is transmitted to a stage moving driver 17 so as to bring the mask 1 and the wafer 2 into alignment with each other in accordance with a global alignment method or die-by-die alignment method, well known in the art. Both of the alignment optical units 19L and 19R are placed at positions not blocking the exposure light (X-rays) within the exposure region.

Figure 12:
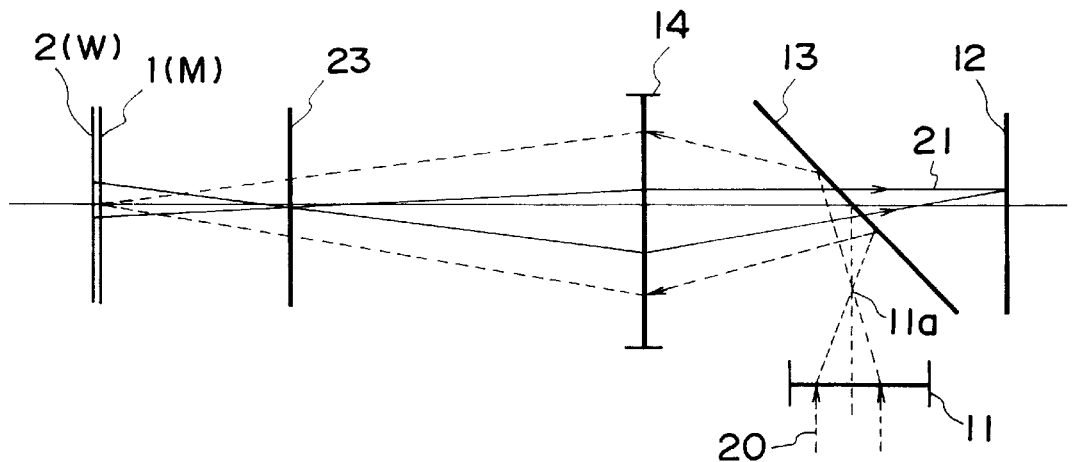
FIG. 12 is a schematic view of an alignment optical head according to an embodiment of the present invention.

Referring now to FIG. 12, the function of light projecting lens 11 (11L, 11R) and light receiving lens 14 (14L, 14R) of the alignment optical unit 19 (19L, 19R) of FIG. 2 will be described.

Light 20 from a light source 10 is once collected by the light projecting lens 11 and then it is reflected by a half mirror 13 toward the lens 14. Here, the lenses 11 and 14 are so designed that, with respect to the lens 14, the light convergence point 11a defined by the lens 11 is placed substantially in an optically conjugate relation with the mask 1. Thus, the projected beam spot on the mask 11 is slightly larger than the alignment mark 3L or 3R. As regards the light reception side, on the other hand, the convergence plane 23 of the light 110 is relayed by the lens 14 to the sensor 12 at a unit magnification.

The basic principle of detection of positional deviation in this embodiment of the present invention will be described with reference to FIG. 5. Although actually the light which is reflectively diffracted by a wafer 2 is used, FIG. 5 illustrates the structure in terms of a transmissive type lens equivalent to it. In FIG. 5, there is a light (1-1-0 light) diffracted at first order by the mask side mark 30a (31a), then diffracted at first order by the wafer side mark 30a (31a) and then simply transmitted through the mask 1. Also, there is light (0-0-1 light) transmitted through the mask side mark 30a (32a), then diffracted at first order by the wafer side mark 30a (31a) and then diffracted by the mask side mark 30a (31a). The light paths of these lights are illustrated in superposition.

On the mask 1, there is an alignment mark (grating lens) 30a comprising a Fresnel zone plate having a power only in the X direction, which is formed on a scribe line. First order transmissively diffractive light from the mark is being influenced by a light converging function. Another alignment mark (grating lens) 30b is formed on a scribe line of a wafer 2, and it comprises a Fresnel zone plate having a power only in the X direction. By this mark, the reflectively diffractively light (shown as transmissive light in FIG. 5) is being influenced by a light diverging function. The diffraction light goes through the mask and is collected upon the sensor 12.

The zone plate combination (grating lenses 30a and 30b) with which the light is influenced by a convex lens function at the mask 1 side and is influenced by a concave lens function at the wafer 2 side, will be referred to as a "convex-concave system".

Additionally, the mask 1 and the wafer 2 are provided with an alignment mark (grating lens) 31a and an alignment mark (grating lens) 31b each comprising a Fresnel zone plate having a power only in the X direction. These marks are formed on respective scribe lines on the mask and the wafer, and they are disposed adjacent to the alignment mark pair 30a and 30b of the convex-concave system. The alignment mark 31a of the mask 1 serves to apply a light diverging function to the first order transmissively diffractive light therethrough. The alignment mark 31b of the wafer 2 serves to apply a light converging function to the reflectively diffractive light therefrom.

Here, the first alignment mark 3L of FIG. 2 corresponds to the alignment marks 30a and 31a, while the second alignment mark 4L corresponds to the alignment marks 30b and 31b.

The combination of alignment marks (zone plates) 31a and 31b with which light is influenced by a concave lens function at the mask 1 side and is influenced by a convex lens function at the wafer 2 side, will be referred to as a "concave-convex system". The light passing through the concave-convex system is collected upon the sensor 12, like the light passing the convex-concave system.

What is described above concerns the light (1-1-0 light) diffracted at first order by the mask side mark (mask side alignment mark), then diffracted at first order by the wafer side mark (wafer side alignment mark) and then transmitted through the mask. Actually, as described hereinbefore, the light (0-1-1 light) transmitted through the mask side mark, then diffracted at first order by the wafer side mark and then diffracted by the mask side mark is approximately collected at a position adjacent to the 1-1-0 light.

FIG. 5 illustrates this. Denoted at 23 is the plane of light convergence (of the 1-1-0 light). If the focal lengths of the alignment marks 30a and 31a of the mask 1 are $Fm_1$ and $Fm_2$, the focal lengths of the alignment marks 30b and 31b of the wafer 2 are $Fw_1$ and $Fw_2$, the spacing between the mask 1 and the wafer 2 is g, and the distance from the mask 1 to the convergence plane 23 is L, then, with a deviation x between the mask 1 and the wafer 2 in the X direction, the positions $S_1$ and $S_2$ of the light convergence points of the 1-1-0 light through the convex-concave system (30a, 30b) and through the concave-convex system (31a, 31b), in the X direction along the light convergence plane, are given by the following equations:

$$S_1 = [1 - L/(Fm_1 - g)] \cdot x \quad (1)$$

$$S_2 = [1 - L/(Fm_2 - g)] \cdot x \quad (2)$$

On the other hand, the positions $S_3$ and $S_4$ of the light convergence points of the 0-1-1 light through the convex-concave system and through the concave-convex system, in the X direction along the light convergence plane 23, are given by the following equations:

$$S_3 = [L'/(Fw_1 - g)] \cdot x \quad (3)$$

$$S_4 = [L''/(Fw_2 - g)] \cdot x \quad (4)$$

where L' and L" are the distances of the convex-concave system and the concave-convex system to the convergence position of 0-1-1 light and to the mask 1, respectively.

For conditions necessary for assuring convergence of 1-1-0 light upon the light convergence plane 23, the following relations are required:

$$1/(Fm_1 - g) + 1/L = -1/Fw_1 \quad (5)$$

$$1/(Fm_2 - g) + 1/L = -1/Fw_2 \quad (6)$$

In this embodiment, in order to provide a magnification of 100× for the position $S_1$ with respect to the mask-to-wafer positional deviation x, numerical values may be L=18.7 mm, g=30 microns, $Fm_1$=214 microns, and $Fw_1$=−184 microns.

On the other hand, as regards the magnification for the position $S_2$, in order that a magnification −100× is provided with respect to the mask-to-wafer positional deviation x, design values of focal lengths $Fm_2$ and $Fw_2$ of the alignment marks 31a and 31b may be −240 microns and 270 microns, respectively.

Here, from equations (1)–(4), as regards the amount of positional deviation (=$S_1$−$S_3$) upon the sensor 12 produced by the magnification difference between the 1-1-0 light ($S_1$) and 0-1-1 light ($S_3$) of the convex-concave system, since it is smaller than the expansion of the respective beam spots, apparently they appear as a single spot B1 upon the sensor 12 surface, as shown in FIG. 3B.

The same applies also to the 1-1-0 light ($S_2$) and 0-1-1 light ($S_4$) of the concave-convex system, and as a spot of the concave-convex system, apparently a single spot B2 is produced. Thus, by measuring the spot distance $d_1$ between the light spots of the convex-concave system (30a, 30b) and the concave-convex system (31a, 31b), the relative positional deviation between the mask 1 and the wafer 2, being enlarged by about 200×, can be detected.

FIG. 6 illustrates the first and second alignment marks 3L and 4L on the mask 1 and the wafer 2, respectively, used in this embodiment.

As shown in FIG. 6, there are mirror image marks (alignment marks) 30am and 30bm corresponding to inverted patterns of the alignment marks 30a and 30b, as well as mirror image marks (alignment marks) 31am and 31bm of the alignment marks 31a and 31b, juxtaposed with each other.

Here, the alignment marks 30a, 30am, 31a and 31am, constituting the first alignment mark 3L, correspond, in order, to the first, second, fifth and sixth grating lenses. The alignment marks 30b, 30bm, 31b and 31bm constituting the second alignment mark 4L correspond, in order, to the third, fourth, seventh and eighth grating lenses.

Groups of alignment marks 30am and 30bm and alignment marks 31am and 31bm will be referred to as "negative marks". Upon the sensor 12, there are produced four signal spots, i.e., positive mark convex-concave system spot B1, positive mark concave-convex system spot B3, negative mark convex-concave system spot B2 and negative mark concave-convex system spot B4. In a state wherein there is no deviation between the mask 1 and the wafer 2, as shown in FIG. 3A, diffractive light from the positive mark convex-concave system (30a, 30b) is being diffracted in a direction of −5 deg., while diffractive light from the positive mark concave-convex system (31a, 31b) is being diffracted in a direction of +2.5 deg. Diffractive light from the negative mark convex-concave system (30am, 30bm) which are mirror images of the positive marks, is being diffracted in a direction of +5 deg, while diffractive light from the concave-convex system is being diffracted in a direction of −2.5 deg. Thus, as shown in FIG. 3B, the four signal spots B1–B4 are separated from each other.

FIG. 4 illustrates the results of measurement of the spacing $d_1$ between the positive mark convex-concave system spot B1 and the positive mark concave-convex system spot B3 as well as the spacing $d_2$ between the negative mark convex-concave system spot B2 and the negative mark concave-convex system spot B4, measured at two gap levels as the wafer is shifted relative to the mask. The magnification M of the spacing $d_1$ to the mask-to-wafer deviation was M=210×, while the magnification m of the spacing $d_2$ to the mask-to-wafer deviation was m=−210×=−M.

It has been confirmed that, when the gap is changed, both of the spot spacings $d_1$ and $d_2$ change as offset in the direction enlarging (or reducing) the spot spacing, within the mask-to-wafer deviation range of ±3 microns, as shown in FIG. 4 (the amount of spot change due to the gap change is Eg, both for the spot spacings $d_1$ and $d_2$).

Next, changes of spot spacings $d_1$ and $d_2$ due to a change in wafer side alignment mark caused by a semiconductor device manufacturing process, will be explained. As described hereinbefore, the four signal spots B1–B4 are combined spots of two lights, i.e., 1-1-0 light and 0-1-1 light. If, for example, regarding the positive mark spots B1 and B3, the beam spot spacing between the 1-1-0 light and 0-1-1 light of the concave-convex system is wider than the beam spot spacing between the 1-1-0 light and 0-1-1 light of the convex-concave system, the spot spacing changes in the direction to be widened as the light quantity of the 0-1-1 light increases as compared with the light quantity of the 1-1-0 light.

On the other hand, regarding the negative marks as defined by mirror images of the positive marks, the spot spacing changes in the direction to be widened as the light quantity of the 0-1-1 light increases as compared with the light quantity of the 1-1-0 light. Here, the intensity ratio between the 1-1-0 light and 0-1-1 light changes with a change in level difference of alignment mark, since the incidence angle upon the wafer alignment mark is different.

Also, since the alignment mark has a power with respect to the positional deviation detecting direction, and since the grating pitch (linewidth) in the mark changes in the positional deviation detecting direction, there occurs non-uniformness of resist film thickness on the mark in accordance with the linewidth in the mark. This results in non-uniformness of diffraction efficiency within the alignment mark. Such non-uniform diffraction efficiency produces deformation of beam spot shape, and causes a change in spot spacing.

If the spot spacing $d_1$ of the positive marks changes to be widened due to non-uniformness of diffraction efficiency, the spot spacing $d_2$ of the negative marks defined by mirror images of the positive marks, also changes in the same direction and by the same amount. The non-uniformness of a resist on a mark changes in dependence upon the center of the wafer, since usually the resist is applied thereto by a spin coating method. Further, the manner of change differs with the level difference of an underlying alignment mark or duty ratio, for example.

The amount of change Ep of the spot spacing as the level difference of underlying mark or the non-uniformness of resist coating changes due to a process, is the same both for the spot spacings $d_1$ and $d_2$ and it is in the same direction. Therefore, the spot spacings $d_1$ and $d_2$ can be expressed, when the mask-to-wafer deviation is x, the magnification of the spot spacing to the mask-to-wafer deviation is M, the spot spacing in a state where there is no mask-to-wafer deviation is $d_0$, the amount of change in the spot spacing caused by a gap setting error is Eg, and the amount of change in the spot spacing caused by a change of mark due to a process is Ep, as follows:

$$d_1 = M^*x + Eg + Ep + d_0 \quad (7)$$

$$d_2 = -M^*x + Eg + Ep + d_0 \quad (8)$$

By calculating the sum of equations (7) and (8), the mask-to-wafer deviation x can be determined as follows:

$$x = (d_1 - d_2)/2M \quad (9)$$

From equation (9), initial spot spacing $d_0$, spot spacing change Eg due to gap setting error, and spot spacing change Ep due to a change in mark, all can be canceled. Therefore, by measuring the spot spacing $d_1$ of the positive marks and the spot spacing $d_2$ of the negative marks, a deviation of the wafer with respect to the mask can be measured without being influenced by the gap setting error or a change of alignment mark.

Although this embodiment has been described with respect to an example wherein the spacing $d_1$ between the spots B1 and B3 and the spacing $d_2$ between the spots B4 and B2 are detected and the mask-to-wafer deviation is calculated in accordance with equation (9), the mask-to-wafer deviation can be measured while canceling the spot spacing change Eg due to gap setting error and the spot spacing change Ep due to a change of a mark, by taking the spacing between the spots B1 and B4 as $d_1$ and taking the spacing between the spots B2 and B3 as $d_2$.

Equation (9) can be considered in a different way. That is, it may correspond to that the spacing between an average position of the convex-concave system beam position B1 and the convex-concave system mirror image mark beam position B2 and an average position of the concave-convex system beam position B3 and the concave-convex system mirror image mark beam position B4, is measured. This may be measured directly, as a matter of course.

As regards the asymmetry of signal waveform resulting from deformation of the wafer side mark due to a process or from a gap setting error, since the mark is formed by a mirror image, the signal waveform will be such as the mirror image signal waveform as illustrated in FIG. 3B. Therefore, the average position of the mirror image waveforms is less influenced by the asymmetry of the waveform.

In this embodiment, in the manner described above, a positional deviation between a mask 1 and a wafer 2 is detected, and high precision alignment of the mask and the wafer is accomplished.

Figure 7:
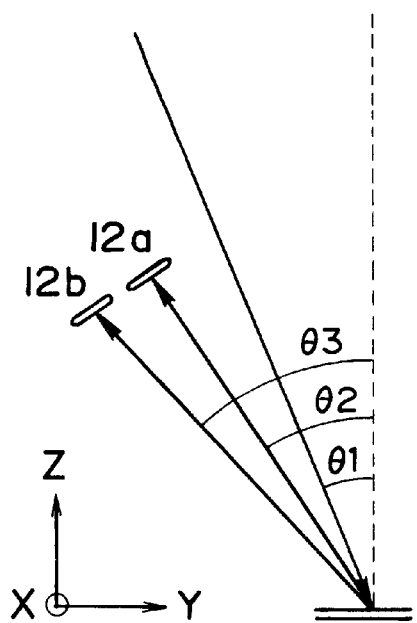
FIG. 7 is a schematic view for explaining the function of a positional deviation detecting system according to a second embodiment of the present invention.
Figure 8:
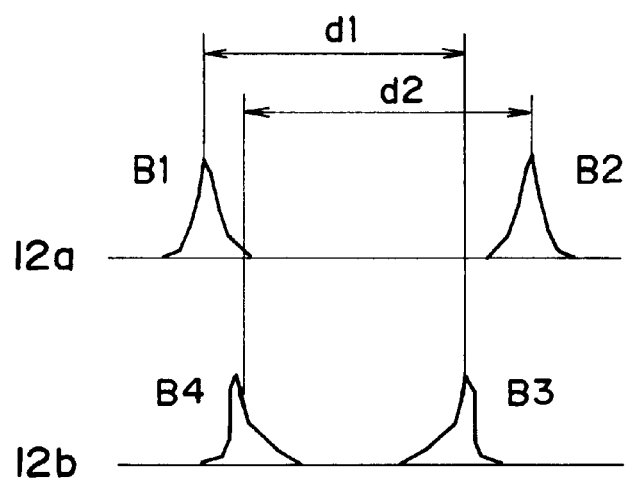
FIG. 8 is a schematic view for explaining a signal waveform upon the sensor surface in the second embodiment of the present invention.

FIG. 7 illustrates paths of alignment light according to a second embodiment of the present invention, and FIG. 8 illustrates signal waveforms in the second embodiment.

In the first embodiment, alignment signal light is received by one line sensor. In this embodiment, as compared therewith, diffractive lights from convex-concave system marks and concave-convex system marks are received by separate line sensors 12a and 12b. This accomplishes an alignment system of a wider detection range. The remaining portion has essentially the same structure as that of the first embodiment.

Namely, disposition of alignment marks (positive and negative marks) as well as powers in alignment direction (i.e., focal lengths of the lenses), for example, are designed essentially the same as those of the first embodiment.

In FIG. 7, the incidence angle $\theta_1$ of alignment light of a wavelength $\lambda$=830 nm is 12 deg., the diffraction angle $\theta_2$ from a convex-concave system mark is 15 deg., and the diffraction angle $\theta_3$ from a concave-convex system mark is 20 deg. The Y-direction pitches of grating lenses as the light is to be diffracted just downwardly (−Z direction) from the mask alignment mark, are set as follows.

Regarding the mask side alignment mark, the Y-direction pitch Pm of the grating lenses is Pm=$\lambda$/sin(12 deg.)=3.99 microns. Regarding the wafer side alignment mark, the Y-direction pitch $Pw_1$ of the convex-concave system grating lens is $Pw_1$=$\lambda$/sin(15 deg.)=3.21 microns, while the Y-direction pitch $Pw_2$ of the concave-convex system grating lens is $Pw_2$=$\lambda$/sin(20 deg.)=2.43 microns.

As shown in FIG. 8, the positions of the spots B1 and B2 upon the sensor 12a as well as the positions of the spots B3 and B4 upon the sensor 12b are detected, and the spacing $d_1$ between the spots B1 and B3 and the spacing $d_2$ between the spots B4 and B2 are determined. Then, in accordance with equation (9) mentioned hereinbefore, the deviation x between the mask and the wafer is calculated.

Figure 9:
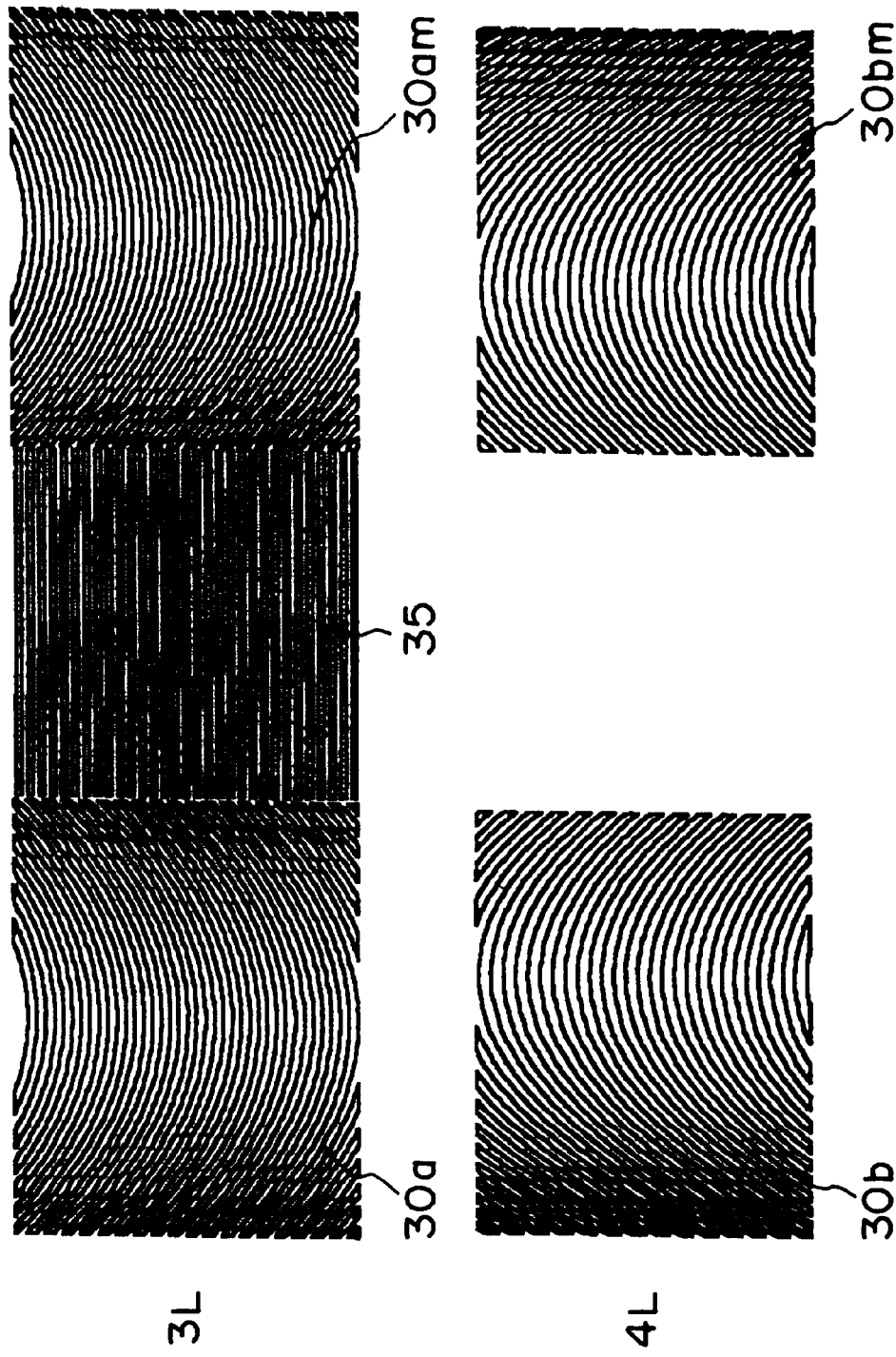
FIG. 9 is a schematic view of alignment marks usable in a positional deviation detecting system according to a third embodiment of the present invention.
Figure 10:
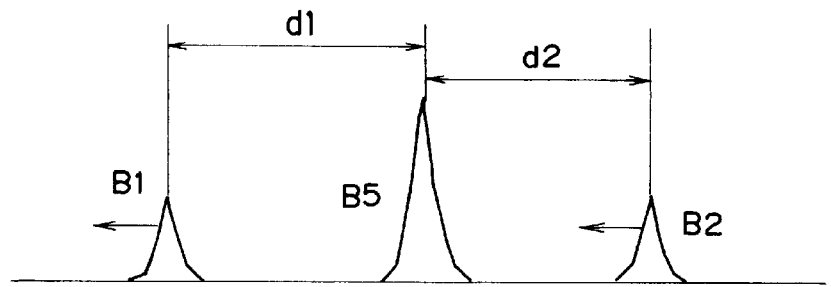
FIG. 10 is a schematic view of a signal waveform upon the sensor surface in the third embodiment of the present invention.

FIG. 9 illustrates alignment marks used in a third embodiment of the present invention, and FIG. 10 illustrates signal waveforms in the third embodiment.

In the first embodiment, each of the first alignment mark 3L of the mask and the second alignment mark 4L of the wafer is provided by four grating lenses, and the mask-to-wafer deviation x is detected on the basis of four beam spots.

In this embodiment, as compared therewith, the first alignment mark 3L of the mask comprises a convex lens 30a, a convex lens 30am (mirror image of the pattern 30a), and a straight grating 35.

Also, the second alignment mark 4L of the wafer is provided by a concave lens 30b, and a concave lens 30bm (mirror image of the pattern 30b). The sensor receives, as shown in FIG. 10, a light spot B1 having been diffracted by the marks 30a and 30b and a light spot B2 having been diffracted by the marks 30am and 30bm which are mirror image marks of the marks 30a and 30b.

Additionally, at the center thereof, the sensor receives a light spot B5 of light diffracted by the straight grating 35 of the mask, then simply reflected by the wafer and then transmitted through the mask.

The spacing $d_1$ between the light spots B1 and B5 and the spacing $d_2$ between the light spots B5 and B2 are detected, and a mask-to-wafer deviation x is calculated in accordance with equation (9). The light diffracted by the straight grating 35 and diffraction grating 30a has no sensitivity to the mask-to-wafer deviation x. However, since the three light spots displace in the same direction in response to any tilt of the wafer, by using this signal light, it is possible to remove the influence of the wafer tilt.

In this embodiment, the detection sensitivity becomes about a half as compared with the first embodiment. However, there is an advantage that the area on the mask and the wafer to be occupied by the alignment marks decreases significantly.

Figure 11:
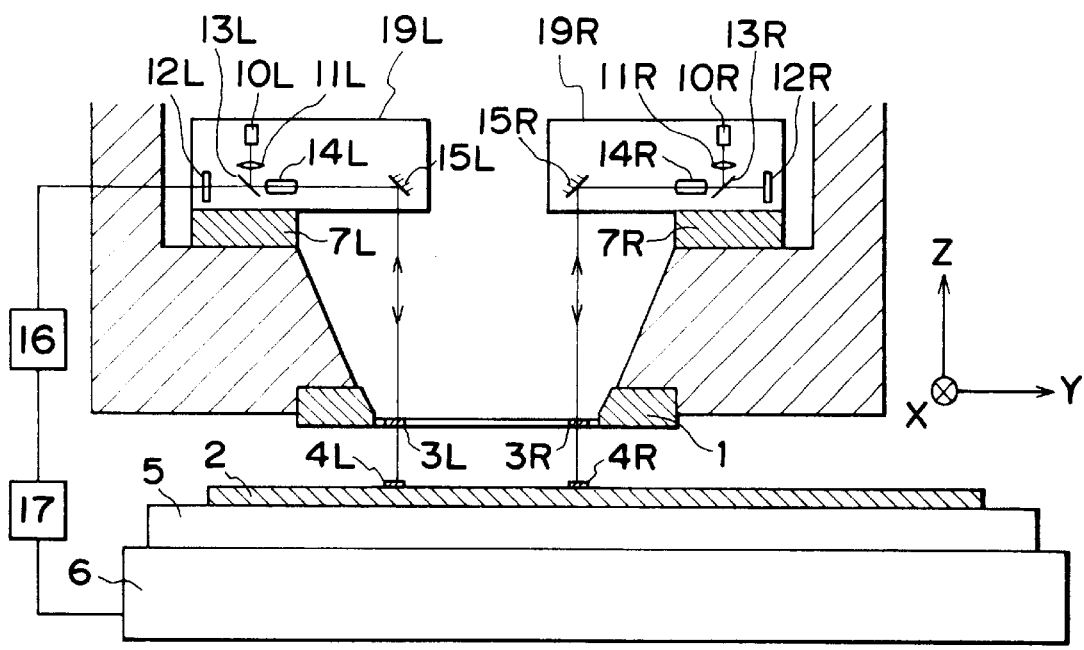
FIG. 11 is a schematic view of a main portion of a positional deviation detecting system according to a fourth embodiment of the present invention.

FIG. 11 is a schematic view of a main portion of a fourth embodiment of the present invention. In this embodiment, a positional deviation detecting system of the present invention is incorporated into an exposure apparatus for the manufacture of devices, using X-rays as an exposure light source. In the drawing, denoted at 1 is a mask (first object), and denoted at 2 is a wafer (second object). The positioning (alignment) of the mask and the wafer is performed by using light from an alignment optical unit 19.

In FIG. 11, on the mask 1, there are alignment marks (first alignment marks) 3L and 3R each comprising a straight Fresnel zone plate (grating lens) having a power only in the X direction, i.e., the direction with respect to which positional deviation between the mask 1 and the wafer 2 is to be detected. On the wafer 2, there are alignment marks (second alignment marks) 4L and 4R each comprising a straight Fresnel zone plate (grating lens) having a power only in the X direction and each to be positioned with respect to the mask alignment mark 3L or 3R.

Denoted at 19L and 19R are alignment optical units each for detecting a positional deviation between the alignment marks 3L and 4L (3R and 4R). These alignment optical units are mounted on movable stages 7L and 7R which are movable in X and Y directions. Since the alignment optical units 19L and 19R have the same structure, the following description will be made only of one alignment optical unit 19L.

Denoted at 10L is a semiconductor laser (light source). The light emitted from the light source 10L goes through a light projecting lens 11L and a half mirror 13L, and it is collected by a lens 14L. Then, the light is reflected by a mirror 15L, and it is projected on the alignment mark (first alignment mark) 3L on the mask 1 perpendicularly. The alignment mark 3L functions to project light in a direction (−Z direction) of a normal of the mask 1, toward and upon the alignment mark (second alignment mark) 4L. The light thus projected on the mark 4L is diffracted perpendicularly in the +Z direction. The diffractive light is transmitted through the mask 1, and it is reflected by the mirror 15L. Then, the light goes through the lens 14L and the half mirror 13L, and it is collected upon a sensor 12L. The sensor 12L comprises a one-dimensional line sensor.

Denoted at 5 in FIG. 11 is a wafer chuck for holding the wafer 2 by attraction. Denoted at 6 is an X-Y-Z stage. The mask 1 and the wafer 2 can be held with a predetermined spacing maintained therebetween, by moving the Z stage.

While not shown in FIG. 11, in addition to the first and second alignment optical units 19L and 19R for detection of a deviation in the X direction, in this embodiment, there are alignment marks comprising straight Fresnel zone plates having a power in the Y direction which are provided on scribe lines upon the mask 1 and the wafer 2, for detection of a positional deviation in the Y direction. A third alignment optical unit for detecting these alignment marks is provided.

Signals from sensors of these alignment optical units are applied to a CPU 16. The amount of deviation in the X direction is detected from an average of sensor outputs of the two alignment optical units for X-direction detection. The rotational amount is detected from the difference between the outputs. The amount of deviation in the Y direction is calculated from the sensor output of the Y-direction alignment optical unit. Positional deviations of a few shots on the wafer 2 are detected in this manner, and a signal is transmitted to a stage moving driver so as to bring the mask 1 and the wafer 2 into alignment with each other in accordance with a global alignment method or die-by-die alignment method, well known in the art.

In this embodiment, in an exposure operation, the first, second and third alignment optical units move away from the center of the shot, so that they do not block the exposure light.

Figure 13:
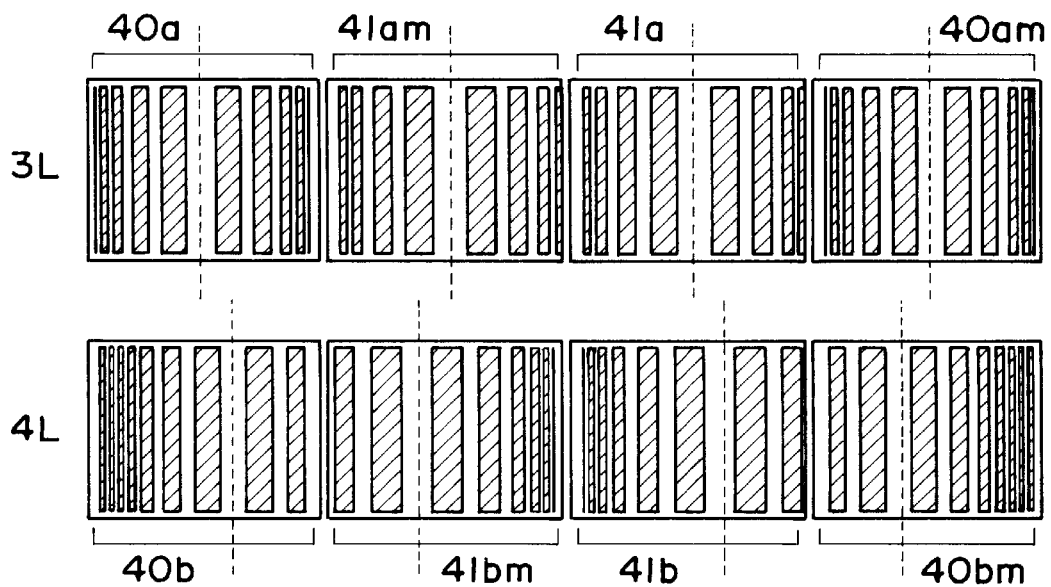
FIG. 13 is a schematic view of alignment marks usable in the fourth embodiment of the present invention.

FIG. 13 is a conceptional view of first and second alignment marks 3L and 4L used in this embodiment. The focal lengths of theses marks as well as the disposition of them are designed similarly as those of the first embodiment.

In FIG. 13, the first alignment mark 3L of the mask 1 comprises a convex lens mark 40a, a concave lens 41a, and mirror image marks 40am and 41am of them. The second alignment mark 4L of the wafer 2 comprises a concave lens 40b, a convex lens 41b, and mirror image marks 40bm and 41bm of them. These marks are juxtaposed with each other.

Like the first embodiment, the spot spacings $d_1$ and $d_2$ of the beam spots of diffraction lights from these grating lenses are detected, and a mask-to-wafer positional deviation x is calculated on the basis of it.

As shown in FIG. 13, since this embodiment uses straight grating lenses, there is an advantage that making the alignment mark is easy.

While the foregoing embodiments have been described with reference to examples of proximity type X-ray exposure apparatus, the present invention is similarly applicable to an X-ray reduction exposure apparatus or a reduction projection exposure apparatus that uses light as exposure light.

Next, a fifth embodiment of the present invention will be described. This embodiment corresponds to a modified form of the preceding embodiment, and it is applied to an exposure apparatus for device manufacture. The whole structure of the apparatus may be similar to that of the FIG. 2 embodiment, and in this embodiment the grating lenses in the alignment marks 3L (4L) and 3R (4R) are replaced by grating lenses shown in FIG. 14.

Figure 14:
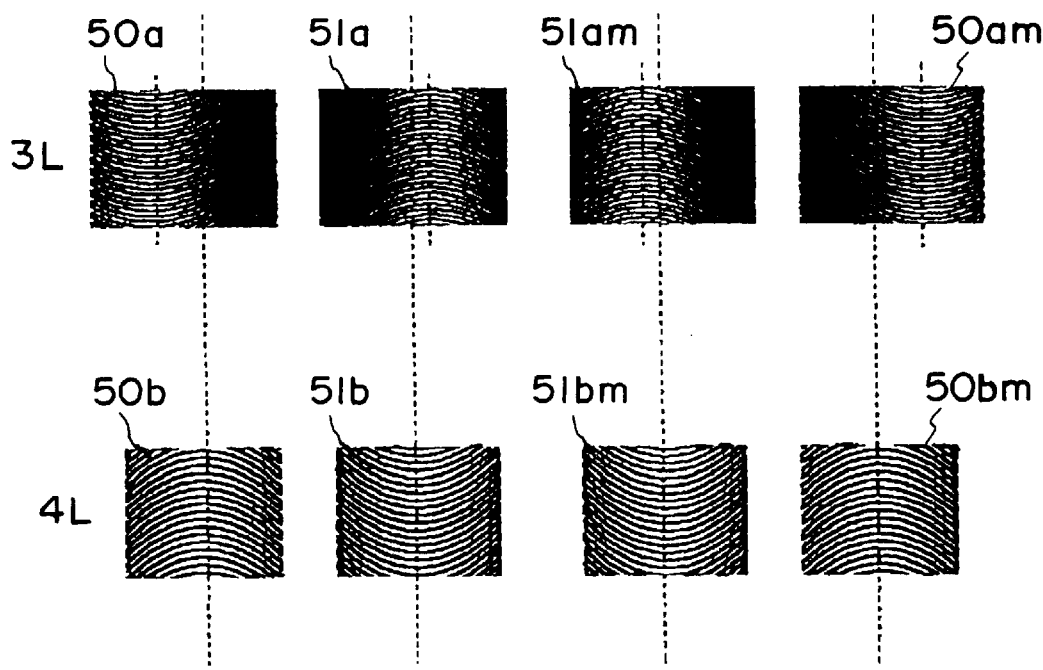
FIG. 14 is a schematic view of alignment marks usable in a positional deviation detecting system according to a fifth embodiment of the present invention.

In FIG. 14, on the mask 1 there are a zone plate 50a having a convex lens function, and a zone plate 51a having a concave lens function. These marks are disposed with their central axes placed with eccentricity in the alignment detecting direction. Also, on the mask 1 there are mirror image marks 50am and 51am which correspond to mirror images of the zone plates 50a and 51a with respect to the Y axis, and which are formed at the mirror image positions, respectively.

On the other hand, on the wafer 2 there are a zone plate 50b having a concave lens function and a zone plate 51b having a convex lens function, as well as mirror image marks 50bm and 51bm of them formed at the mirror image positions with respect to the Y axis. The focal lengths of these grating lenses (zone plates) are similar to those of the first embodiment.

This embodiment differs from the first embodiment in that, while in the first embodiment, light is diffracted perpendicularly from the mask and the beam spot is separated from the center of the sensor due to the eccentricity of the wafer side lens, in this embodiment, the mask side mark is placed with eccentricity and diffraction light therefrom is tilted toward the alignment detecting direction, by which the light is separated away from the central portion of the sensor such that it is not influenced by noise at the sensor central portion.

As shown in FIG. 14, all the grating lenses 50b, 51b, 50bm, and 51bm of the wafer are placed with their central axes registered with the central axes of the respective marks (i.e., symmetrical mark shape structure).

Therefore, the beam profile of the diffraction light therefrom has a symmetric shape. Namely, even if the diffraction efficiency varies in dependence upon the pitch in the grating due to a process, the beam spot deforms while maintaining the symmetry of the beam profile. As a result, a change in gravity center position of each beam spot becomes very small. The dependency upon the process is therefore small.

Like the first embodiment, if the distance between the beam spot gravity center position B1 of the convex-concave system (50a, 50b) and the beam spot gravity center position B3 of the concave-convex system (51a, 51b) upon the sensor is $d_1$, and the distance between the beam spot gravity center position B2 of light from the convex-concave system mirror image marks 50am and 50bm and the beam spot gravity center position B4 of the concave-convex system mirror image marks 51am and 51bm upon the sensor is $d_2$, then in equations (7) and (8) it can be approximated that Ep=0.

By taking the sum of equations (7) and (8), the following relation applies:

$$Eg=(d_1+d_2)/2+d_0 \qquad (10)$$

The spacing (gap) g between the mask 1 and the wafer 2 can be expressed, while taking the magnification as m and the offset as go, as follows:

$$g=(d_1+d_2)/m+g_0 \qquad (11)$$

It has been confirmed that, in a case where, as in equation (11), the deviation in the lateral direction (X direction) is small (not greater than 3 microns), without being dependent upon the positional deviation, the detection with respect to the gap direction (Z direction) is accomplished at a precision of a submicron order. As regards the offset $g_0$, calibration of it by use of any other gap sensor (e.g., electrostatic capacitance sensor) is necessary.

Figure 15:
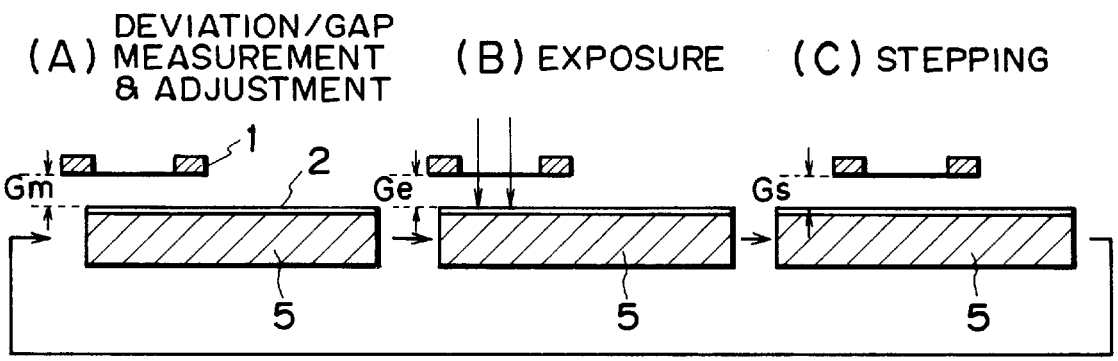
FIG. 15 is a schematic view for explaining the relation between a mask and a wafer in a die-by-die alignment process in an embodiment of the present invention.

Next, the positioning method according to this embodiment will be described. FIG. 15 illustrates the relation between a mask 1 and a wafer 2 in a case where a die-by-die alignment method in which the positioning is performed with respect to every shot, is used. At (A) in FIG. 15, a predetermined shot of the wafer 2 is brought to a position below the mask 1 with the stage precision and, thereafter, positional deviation measurement as well as gap measurement are performed. If the gap set position is beyond a predetermined amount, gap adjustment is made and, subsequently, positional deviation (shift and rotation) is adjusted into a predetermined tolerance.

Subsequently, at (B) in FIG. 15, the exposure operation is performed and, thereafter, the wafer stage 15 is moved stepwise toward the next shot position, as shown at (C) in FIG. 15. As above, the case wherein the alignment measurement gap (Ga), the gap measurement gap (Gg), the exposure gap (Ge) and the step gap (Gs) are all the same, is advantageous with respect to the throughput.

Of course, in a proximity exposure apparatus, the smaller the exposure gap is, the better the resolution is. Therefore, the alignment gap (Ga) and the gap measurement gap (Gg) as well as the step gap (Gs) may be the same (for example, Ga=Gg=Gs=30 microns), and only the exposure gap (Ge) may be set small (e.g., Ge=15 microns).

At (B) in FIG. 15, on the basis of the gap as measured at the alignment gap, the Z-axis stage is moved so that the exposure gap is brought to a predetermined level and, thereafter, the exposure operation is done.

In this embodiment, the mask and the wafer are provided with marks and the gap measurement is made by using diffraction light from these marks. Therefore, for exposure of a first layer, a separate gap measurement mark should be provided on the mask by which the gap measurement can be performed without any mark on the wafer. An example is disclosed in Japanese Laid Open Patent Application No. 2-167413.

Figure 16:
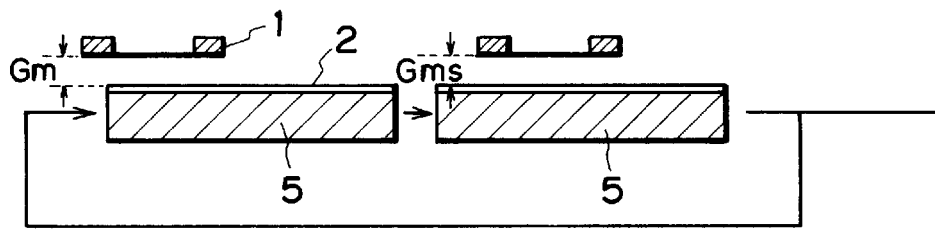
FIG. 16 is a schematic view for explaining the relation between a mask and a wafer in a global alignment process in an embodiment of the present invention.
Figure 16:
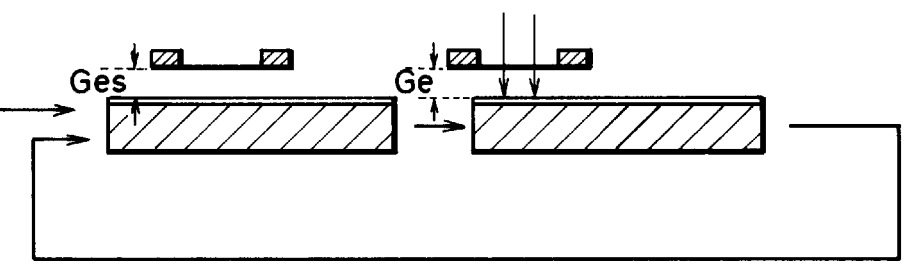

Referring to FIG. 16, a sequential operation of global alignment in which the shot layout on a wafer is measured and the wafer stage axis is brought into registration with it, will be explained.

At (A) and (B) in FIG. 16, positional deviations of and gaps at a few predetermined shots are measured, and a deviation between the layout of shots transferred to the wafer and the wafer stage axis of the exposure apparatus is detected. Then, correction amounts for every shot is determined. Further, from the gap measured values, information about the wafer surface shape is detected.

At (C) in FIG. 16, the shot layout deviation is corrected, and the wafer stage is stepped to the exposure shot. Further, on the basis of the wafer surface shape data, the gap setting is performed. At (D) in FIG. 16, the exposure process is performed.

Subsequently, the operations at (C) and (D) in FIG. 16 are repeated. As regards gap set value, one of the following two may be selected:

Gm=Gms≠Ges=Ge or

Gm=Gms=Ges=Ge.

In any of the die-by-die alignment method and the global alignment method, the positional deviation measurement and the gap measurement can be performed with the same gap (Gm=Ga=Gg) as in this embodiment. This is advantageous in with respect to the throughput, as compared with an example where gaps are different.

If positional deviation measurement (and gap measurement) can be made even at the exposure position, as in this embodiment, there is another and significant advantage. In a global alignment procedure, as for shot layout transformation parameters, generally six parameters of shift (Sx, Sy), rotation (Rx, Ry) and scale (Bx, By) are used to transform the polar coordinate system with a linear formula. In such a case, however, there are two problems involved:

(a1) A local distortion component caused by a difference in wafer process or wafer chucking state cannot be corrected; and (a2) A positional deviation measurement error at an alignment measurement shot applies influence to all the shots.

Figure 17:
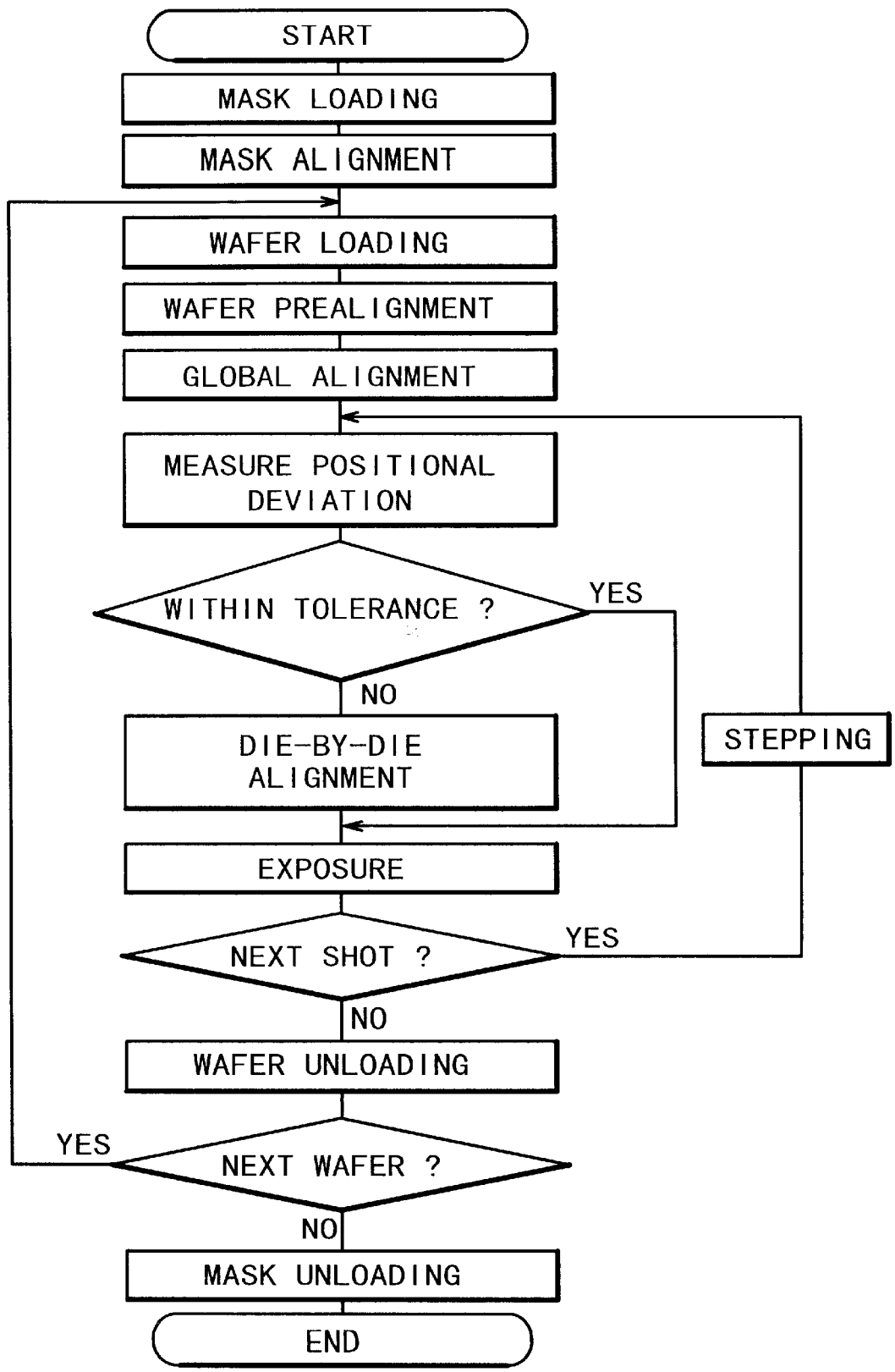
FIG. 17 is a flow chart for explaining the sequence of a combined global and die-by-die alignment mode, in an embodiment of the present invention.

These two problems can be solved by the present invention. As regards the first problem (a1), in this embodiment as shown in FIG. 17, global alignment is made in a usual way and, after stepwise motion to the exposure shot, a positional deviation is measured again. In a case where the wafer shot position is in the polar coordinate system having been linearly transformed, the positional deviation at this moment is substantially zero.

However, for a shot where local distortion is produced, as shown in FIG. 18, the positional deviation increases largely. Thus, a certain tolerance is set (in this embodiment, shift 20 nm and rotation 0.2 urad), and there is a mode prepared by which, for a shot beyond this tolerance, the X and Y deviations and chip rotation are corrected, like the die-by-die mode. This is a combined global and die-by-die mode.

Further, if the gap measured value is over the tolerance, it is corrected by use of the Z tilt stage.

For the same process lot or if the combination of steppers used is the same, the position where local distortion is produced has a good reproducibility. Therefore, preferably, measurement data of the alignment detecting system at the exposure operation may be calibrated on the basis of data of a registration precision inspection system, obtainable by use of a preceding wafer or wafers, and after that the global alignment may be made mainly, with die-by-die alignment and exposure being specifically made to a shot having large local distortion.

Figure 19:
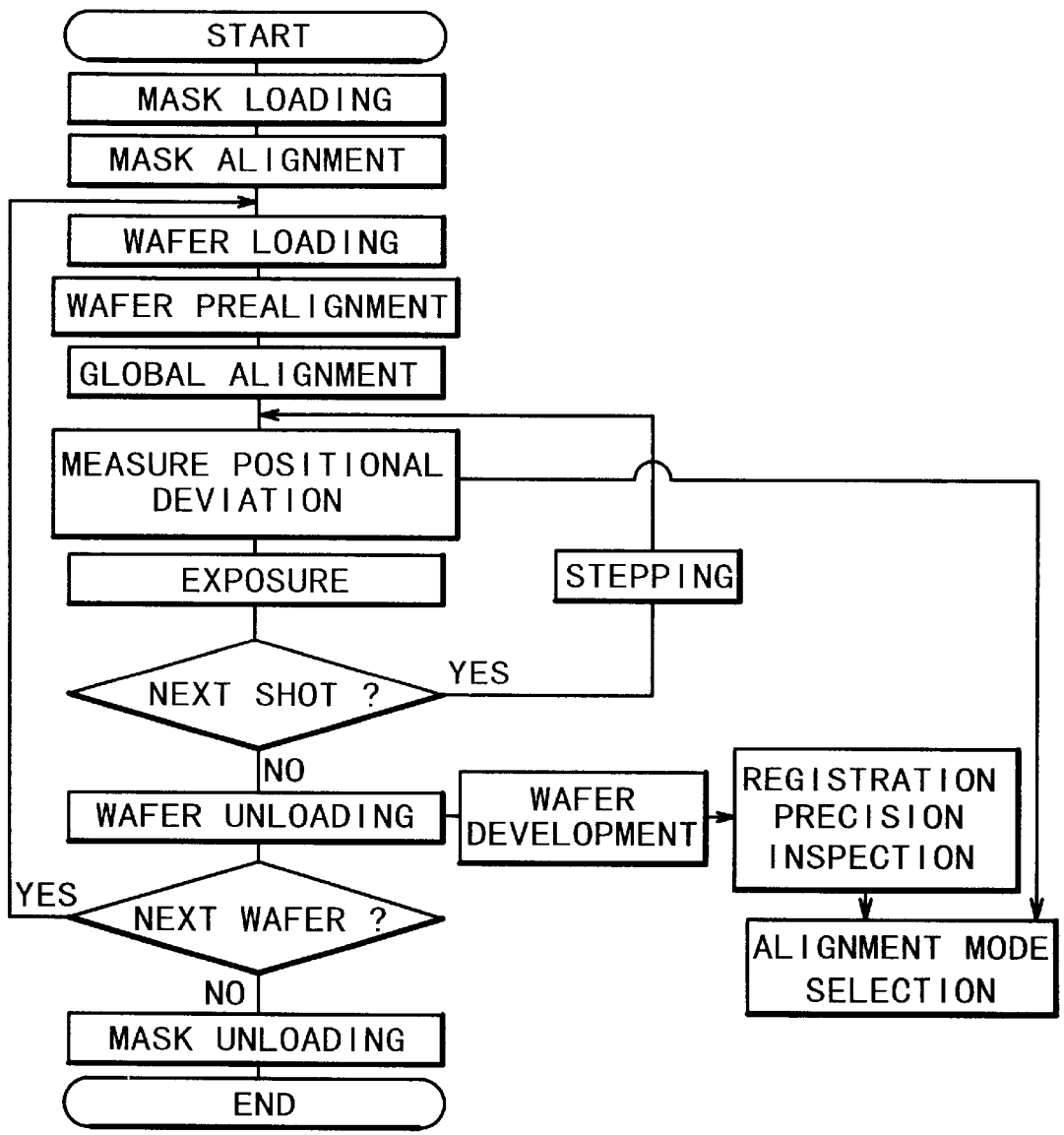
FIG. 19 is a flow chart for explaining the sequence of wafer exposure, in an embodiment of the present invention.

The second problem (a2) described above can be solved as follows. FIG. 19 shows the procedure in which a few wafers are exposed as preceding wafers, prior to a start of the exposure for the lot.

As illustrated, when global alignment is executed, the exposure operation is performed while positional deviations of shots are measured as detection values of the alignment system. After the exposure operation, a registration precision inspection system is used to detect the precision of registration, in regard to every shot, between a pattern already printed on the shot and the pattern just transferred to it, whereby registration a precision inspection value is obtained.

Figure 20:
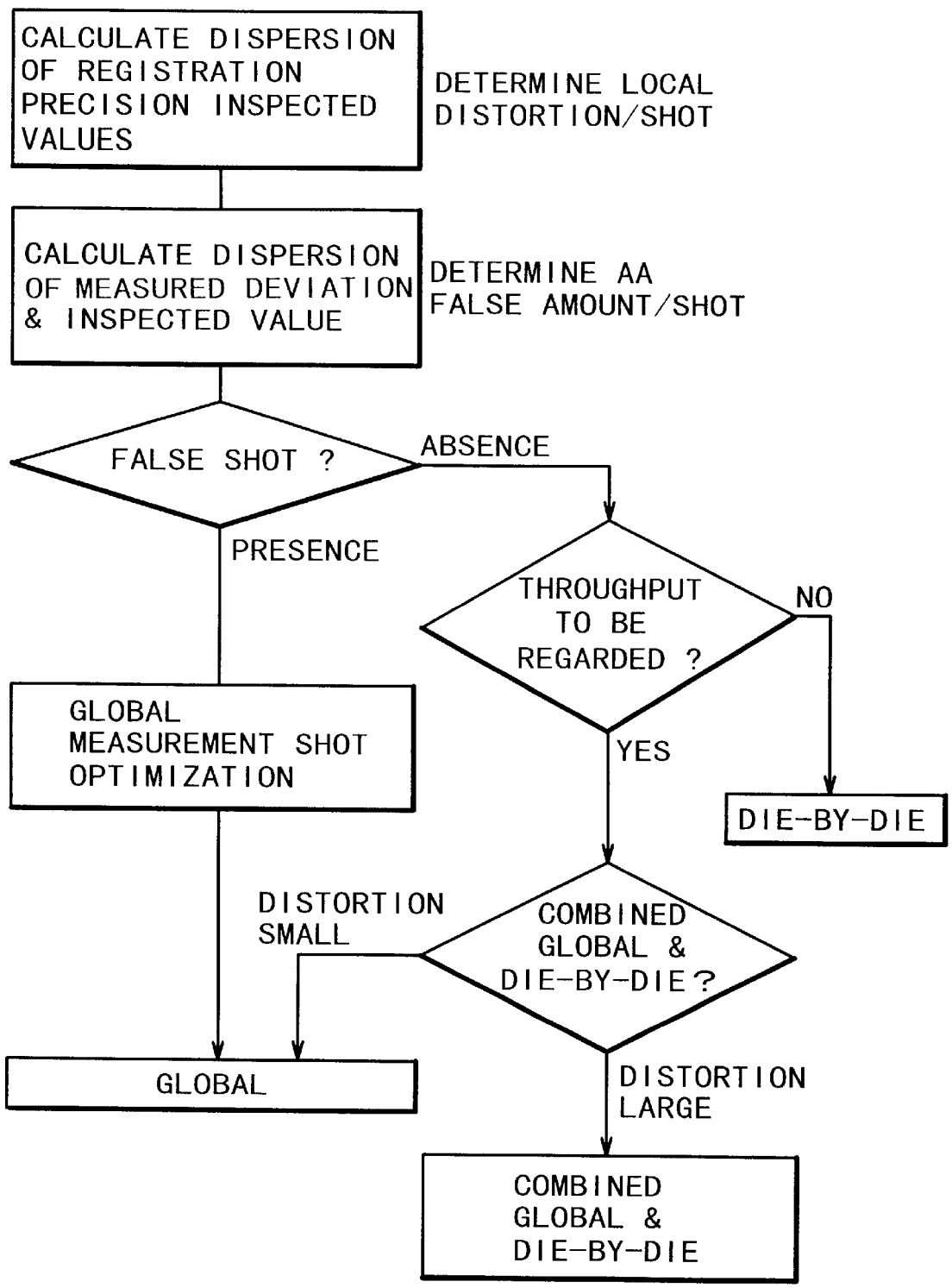
FIG. 20 is a flow chart for explaining alignment mode selection, in an embodiment of the present invention.

After that, the alignment mode to be selected for the succeeding wafers is determined. The alignment system of this embodiment of the present invention has three alignment modes, and the flow chart of FIG. 20 illustrates the selection of alignment mode. In FIG. 20, at a first step, on the basis of the registration precision inspection value, correction is made by use of the six parameters of shift (Sx, Sy), rotation (Rx, Ry) and scale (Bx, By). From the remainder, the position of local distortion and its amount are determined.

At a second step, from a difference between the positional deviation measured value and the registration precision inspection value, the measurement error amount of the alignment detecting system and the corresponding shot are detected. If there is no measurement false shot (with a difference greater than a predetermined value) and the limitation to the throughput is loose, the die-by-die alignment mode (A) is selected, and the exposure operation is performed.

If there is no measurement false shot but there is a strict limitation to the throughput, the combined global and die-by-die alignment mode (B) is selected, and the exposure operation is performed. If there is a measurement false shot in the alignment system, optimization of a combination of global alignment shots (i.e., those shots to be measured beforehand at the global alignment operation) is performed.

As regards this optimization, from those shots other than the measurement false shot, detected values of an imaginary global measurement shot number (e.g., four shots) is extracted. On the basis of this value, the six parameters of shift (Sx, Sy), rotation (Rx, Ry) and scale (Bx, By) with which the imaginary global measurement shot number is minimized, are calculated, and by using these parameters, the detected values of all the shots are corrected.

This calculation operation is made with respect to all the combinations of global measurement shots. Among them, a combination of measurement shots with which dispersion of detected values after being corrected is minimized, is selected. With this procedure, any false reading of the alignment detecting system is not included in the global alignment measurement shots, such that deterioration of registration precision due to a false process can be prevented.

In a case where there is a false shot or a case where there is no false shot but the local distortion is small and the throughput is strict, the sole global alignment mode (C) is selected.

Next, a sixth embodiment of the present invention will be described. This embodiment corresponds to a modified form of the preceding embodiment, and it is applied to an exposure apparatus for device manufacture. The whole structure of the apparatus may be similar to that of the first embodiment of FIG. 2, and in this embodiment the grating lenses in the alignment marks 3L (4L) and 3R (4R) are replaced by grating lenses shown in FIG. 21.

Figure 21:
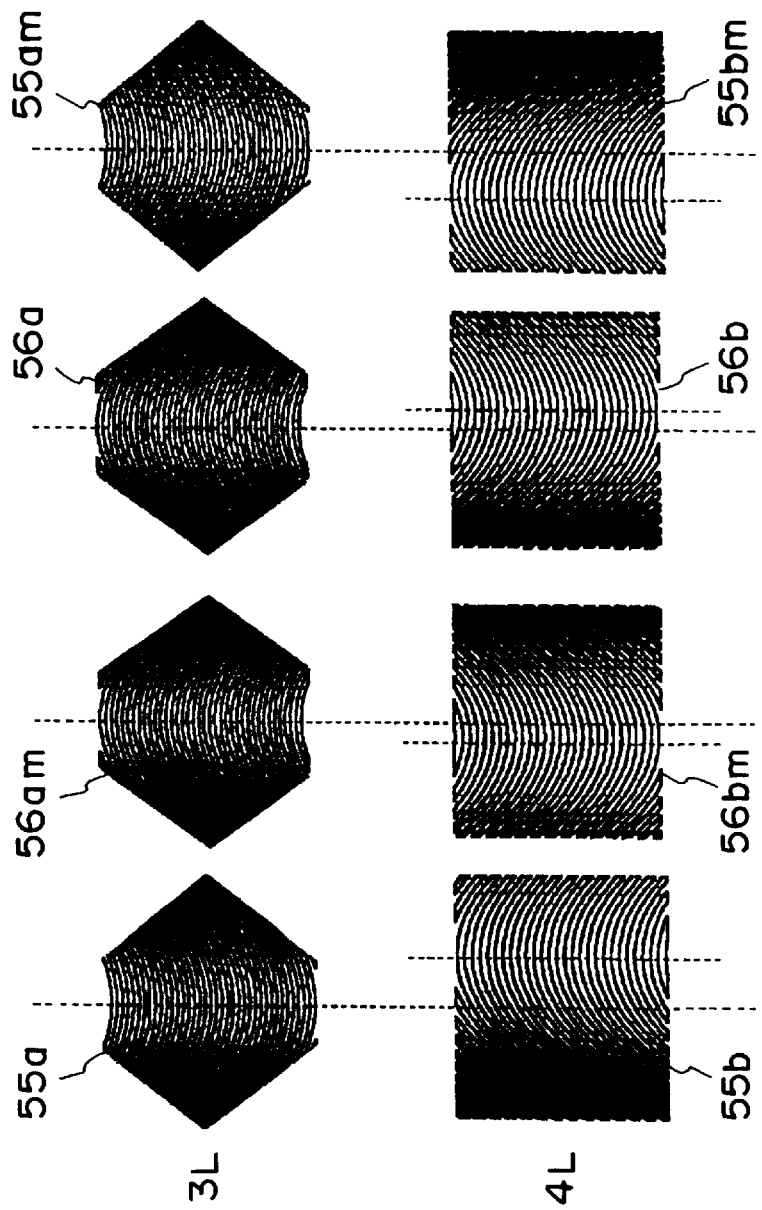
FIG. 21 is a schematic view of alignment marks usable in a positional deviation detecting system according to a sixth embodiment of the present invention.

In FIG. 21, on the mask 1 there are a zone plate 55a having a convex lens function, and a zone plate 56a having a concave lens function. These marks are disposed with their central axes placed with eccentricity in the alignment detecting direction. Also, on the mask 1 there are mirror image marks 55am and 56am which correspond to mirror images of the zone plates 55a and 56a with respect to the Y axis, and which are formed at the mirror image positions, respectively.

On the other hand, on the wafer 2 there are a zone plate 55b having a concave lens function and a zone plate 56b having a convex lens function, as well as mirror image marks 55bm and 56bm of them formed at the mirror image positions with respect to the Y axis.

The focal lengths of these grating lenses (zone plates) are similar to those of the fifth embodiment.

Figure 22:
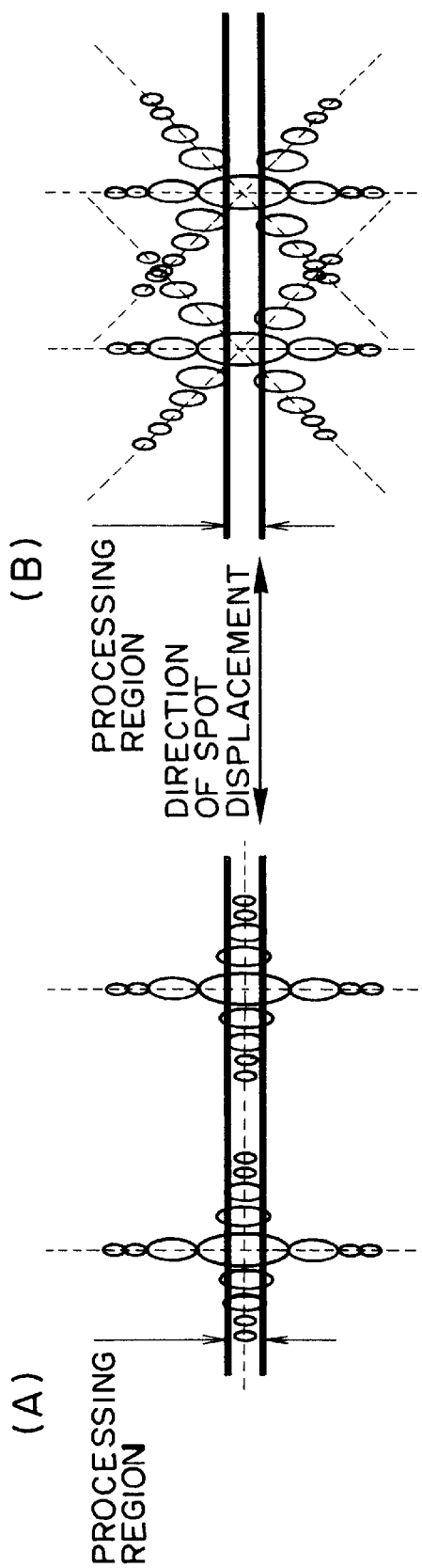
FIG. 22 is a schematic view of alignment marks usable in an embodiment of the present invention.

This embodiment differs from the fifth embodiment in the shape (opening) of the mask side mark. In the fifth embodiment, the mark has a rectangular shape. Diffraction light from it is influenced by Fraunhofer diffraction, such that there are produced perpendicular side-lobes at sides of the mark, such as shown in FIG. 22 at (A). It is therefore necessary that the measurement is made at the position where the side-lobes of the two beam spots do not influence upon each other.

With the alignment marks used in this embodiment, as compared therewith, side-lobes are produced in directions away from the sensor surface, such as shown in FIG. 22 at (B). Therefore, the signal spots can be placed close to each other. This allows to make small the numerical aperture (NA) of the light receiving lens in the alignment detecting system, such that the alignment detecting system can be made smaller in size. Alternatively, if the same alignment detecting system is used, the measurement dynamic range can be advantageously widened.

While this embodiment uses a mask side mark of hexagonal shape, any other shape (polygonal shape) may be used with similar advantageous effects, provided that side-lobes are produced in a direction away from the sensor. Further, not only the mask side mark but also the wafer side mark may be formed with a hexagonal shape.

Next, an embodiment of a semiconductor device manufacturing method which uses a projection exposure apparatus such as described above, will be explained.

Figure 23:
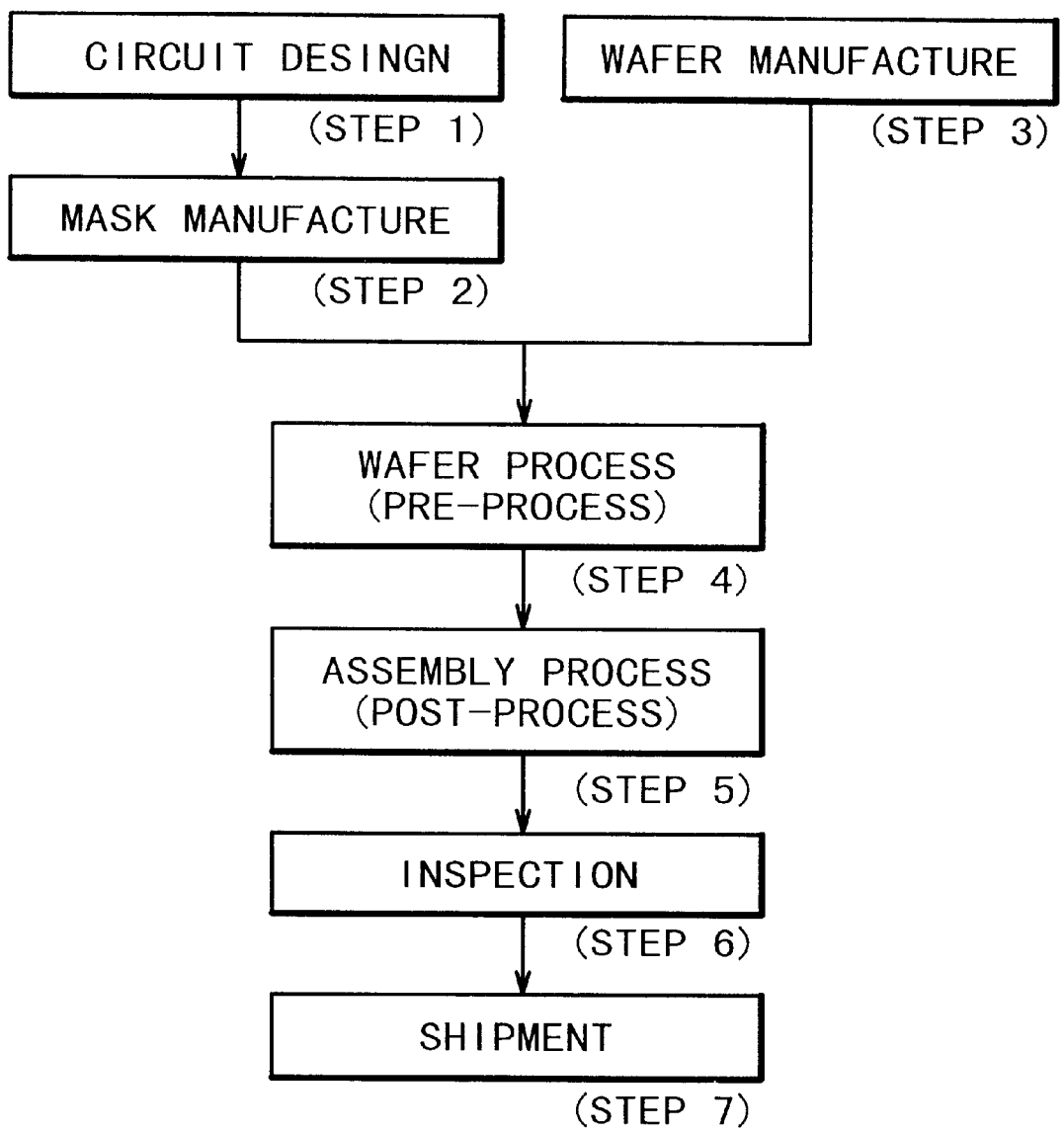
FIG. 23 is a flow chart of device manufacturing processes, in an embodiment of the present invention.

FIG. 23 is a flow chart of a procedure for the manufacture of microdevices such as semiconductor chips (e.g., ICs or LSIs), liquid crystal panels, CCDs, thin film magnetic heads or micro-machines, for example.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a pre-process wherein, by using the so prepared mask and wafer, circuits are practically formed on the wafer through lithography. Step 5 subsequent to this is an assembling step which is called a post-process wherein the wafer having been processed by step 4 is formed into semiconductor chips. This step includes an assembling (dicing and bonding) process and a packaging (chip sealing) process. Step 6 is an inspection step wherein an operation check, durability check and so on for the semiconductor devices provided by step 5, are carried out. With these processes, semiconductor devices are completed and they are shipped (step 7).

Figure 24:
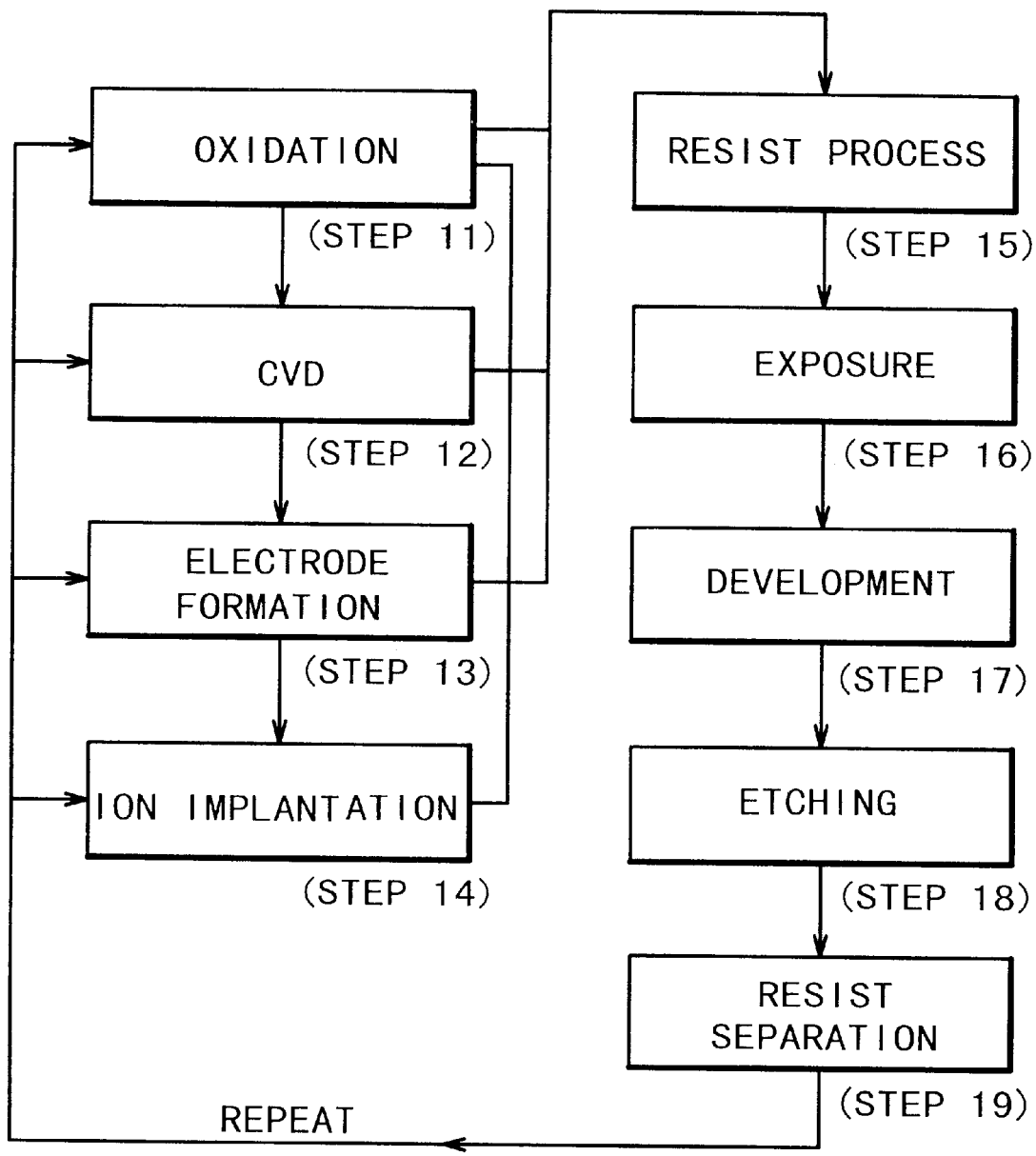
FIG. 24 is a flow chart for explaining a wafer process in the sequence of FIG. 23.

FIG. 24 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

In accordance with the embodiments of the present invention as described above, a first object (mask) and a second object (wafer) are provided with appropriately set plural grating lenses each having a power in the positional deviation detecting direction (X direction), and a relative positional deviation between the mask and the wafer can be detected at high precision on the basis of a deviation of incidence positions, upon a predetermined plane, of spots of light coming from the grating lenses of the mask and the wafer. Thus, a positional deviation detecting method and/or a device manufacturing method based on it, by which high precision alignment is accomplished, is provided.

Particularly, in a case where a mask and a wafer are provided with grating lenses having a power in a positional deviation detecting direction (X direction) and a positional deviation between the mask and the wafer is detected on the basis of a positional deviation of light spots through the grating lenses of the mask and the wafer, there may be provided first and third grating lenses effective to enlarge the spot spacing of diffraction lights, for a mask-to-wafer positional deviation, as well as second and fourth grating lenses having patterns corresponding to mirror images of the first and third grating lenses with respect to the mark center line (Y axis) and being effective to reduce the spot spacing, for the mask-to-wafer positional deviation, the second and fourth grating lenses being juxtaposed with the first and third grating lenses. Positional deviation between the mask and the wafer and the spacing therebetween may be detected by using a first spot B1 obtainable from diffraction lights from the first and third grating lenses and a second spot B2 obtainable from diffraction lights from the second and fourth grating lenses. This reduces the influence of variation in semiconductor manufacturing process such as non-uniformness of diffraction efficiency in the wafer side grating lens, or the influence of gap setting error, such that higher precision detection of positional deviation is assured.

As a result, the yield of semiconductor chips can be enlarged. Additionally, the gap setting precision can be lowered. This is effective to increase the throughput of a semiconductor exposure apparatus.

A mask and a wafer may be provided with alignment marks, and first and second alignment optical heads may be disposed at positions not blocking or absorbing the exposure light. Alignment light may be projected obliquely, and light from alignment marks may be received. This enables positional deviation detection and gap measurement, at the exposure position.

For execution of global alignment, positional deviations may be detected prior to exposure of shots. Registration errors of an exposed wafer or wafers may be measured, and on the basis of the positional deviation measured values and registration measured values, selection of a global alignment mode, a combined global and die-by-die alignment mode and a die-by-die alignment mode may be made. This enables high precision alignment and exposure, without being influenced by a false reading of an alignment system due to a wafer process or any local distortion.

By comparing positional deviation measured values of shots by the alignment system with registration measured values, a false shot of the alignment system may be determined and it may be excluded out of the global measurement shots. Global measurement shots with which registration errors of shots on the whole wafer surface are minimized, may be selected. This enables high precision positioning and exposure without being influenced by false readings of an alignment system due to a wafer process.

While the invention has been described with reference to the structures disclosed herein, it is not confined to the details set forth and this application is intended to cover such modifications or changes as may come within the purposes of the improvements or the scope of the following claims.

What is claimed is:

1. A method of detecting a relative positional deviation between a first object and a second object, opposed to each other, with respect to a predetermined direction by use of a first alignment mark provided on the first object and a second alignment mark provided on the second object, said method comprising:

a first step for providing the first alignment mark by use of a first grating lens and a second grating lens having a mirror image of the first grating lens;

a second step for providing the second alignment mark by use of a third grating lens and a fourth grating lens having a mirror image of the third grating lens;

a third step for detecting incidence position information related to first light coming via the first grating lens and the third grating lens and incident upon a first predetermined plane;

a fourth step for detecting incidence position information related to second light coming via the second grating lens and the fourth grating lens and incident upon a second predetermined plane; and a fifth step for detecting a relative positional deviation between the first and second objects in the predetermined direction, on the basis of the detection of incidence position information related to the first and second lights.

2. A method according to claim 1, wherein each of the first to fourth grating lenses comprises a straight grating lens.

3. A method according to claim 1, wherein the predetermined direction is one of a direction parallel to one of the surfaces of the first and second objects and a direction along which the first and second objects are disposed.

4. A method according to claim 1, wherein, in said first step for providing the first alignment mark, a fifth grating lens and a sixth grating lens having a mirror image of the fifth grating lens are also provided, wherein, in said second step for providing the second alignment mark, a seventh grating lens and an eighth grating lens having a mirror image of the seventh grating lens are also provided, wherein said method further comprises a sixth step for detecting incidence position information about third light coming via the fifth grating lens and the seventh grating lens and incident upon a third predetermined plane and incidence position information about fourth light coming via the sixth grating lens and the eighth grating lens and incident upon a fourth predetermined plane, and wherein in said fifth step the relative positional deviation is detected by use of the incidence position information related to the first to fourth lights.

5. A method according to claim 1, further comprising providing a straight grating on the first object, wherein, in said third and fourth steps for detecting incidence positions of the first and second lights, light coming via the straight grating and reflected by the second object, is detected.

6. An exposure apparatus for transferring, by exposure, a pattern of a mask to a workpiece disposed opposed to the mask, said apparatus comprising:

mask holding means for holding the mask, wherein the mask is provided with a first alignment mark including a first grating lens and a second grating lens having a mirror image of the first grating lens;

workpiece holding means for holding the workpiece, wherein the workpiece is provided with a second alignment mark including a third grating lens and a fourth grating lens having a mirror image of the third grating lens;

an alignment detecting system for detecting incidence position information related to first light coming via the first grating lens and the third grating lens and incident upon a first predetermined plane, and for detecting incidence position information related to second light coming via the second grating lens and the fourth grating lens and incident upon a second predetermined plane; and a position controlling system for relatively aligning the mask and the workpiece in the predetermined direction, on the basis of the detection of incidence positions of the first and second lights, wherein the pattern transfer is performed between the mask and the workpiece thus relatively aligned with each other.

7. An apparatus according to claim 6, wherein the mask is further provided with a fifth grating lens and a sixth grating lens having a mirror image of the fifth grating lens, as the first alignment mark, the workpiece is further provided with a seventh grating lens and an eighth grating lens having a mirror image of the seventh grating lens, as the second alignment mark, said alignment detecting system detects incidence position information about third light coming via the fifth grating lens and the seventh grating lens and incident upon a predetermined plane and incidence position information about fourth light coming via the sixth grating lens and the eighth grating lens and incident upon a predetermined plane, and said position controlling system performs the relative alignment on the basis of the incidence position information related to the first to fourth lights.

8. An apparatus according to claim 6, wherein the mask is further provided with a straight grating, and said alignment detecting system detects the first and second lights of light coming via the straight grating and reflected by the workpiece.

9. A device manufacturing method, comprising:

detecting a relative positional deviation between a mask and a workpiece, opposed to each other, with respect to a predetermined direction by use of a first alignment mark provided on the mask and a second alignment mark provided on the workpiece, wherein said detecting step includes (i) a first step for providing the first alignment mark by use of a first grating lens and a second grating lens having a mirror image of the first grating lens, (ii) a second step for providing the second alignment mark by use of a third grating lens and a fourth grating lens having a mirror image of the third grating lens, (iii) a third step for detecting incidence position information related to first light coming via the first grating lens and the third grating lens and incident upon a first predetermined plane, (iv) a fourth step for detecting incidence position information related to second light coming via the second grating lens and the fourth grating lens and incident upon a second predetermined plane, and (v) a fifth step for detecting a relative positional deviation between the mask and the workpiece in the predetermined direction, on the basis of the detection of incidence position information related to the first and second lights;

relatively aligning the mask and the wafer on the basis of the detected relative positional deviation between them;

exposing the workpiece to the mask relatively aligned with the workpiece; and developing the exposed workpiece.

10. A method according to claim 9, wherein, in said first step for providing the first alignment mark, a fifth grating lens and a sixth grating lens having a mirror image of the fifth grating lens are also provided, in said second step for providing the second alignment mark, a seventh grating lens and an eighth grating lens having a mirror image of the seventh grating lens are also provided, and said method further comprises a sixth step for detecting incidence position information about third light coming via the fifth grating lens and the seventh grating lens and incident upon a predetermined plane and incidence position information about fourth light coming via the sixth grating lens and the eighth grating lens and incident upon a predetermined plane, and wherein in said fifth step the relative positional deviation is detected by use of the incidence position information related to the first to fourth lights.

11. A method according to claim 9, further comprising providing a straight grating on the mask, wherein, in said third and fourth steps for detecting incidence positions of the first and second lights, light coming via the straight grating and reflected by the workpiece, is detected.

12. A method according to claim 1, wherein the first and second planes are defined on one and the same sensor.

13. A method according to claim 6, wherein the first and second planes are defined on one and the same sensor.

14. A method according to claim 9, wherein the first and second planes are defined on one and the same sensor.

* * * * *

UNITED STATES PATENT AND TRADEMARK OFFICE
CERTIFICATE OF CORRECTION

PATENT NO.    : 6,285,033 B1                                      Page 1 of 1
DATED         : September 4, 2001
INVENTOR(S)   : Takahiro Matsumoto It is certified that error appears in the above-identified patent and that said Letters Patent is hereby corrected as shown below:

Drawing sheet 20,
In "(STEP 1)" of FIG. 23, "DESINGN" should read -- DESIGN --.

Column 1,
Line 38, "are" should read -- is --.

Column 14,
Line 20, "go," should read -- $g_o$, --.

Column 15,
Line 29, "in" should be deleted.

Signed and Sealed this

Ninth Day of April, 2002

*Attest:*

JAMES E. ROGAN
*Attesting Officer*   Director of the United States Patent and Trademark Office